(12) United States Patent
Yekhanin et al.

(10) Patent No.: US 9,244,761 B2
(45) Date of Patent: Jan. 26, 2016

(54) ERASURE CODING ACROSS MULTIPLE ZONES AND SUB-ZONES

(71) Applicant: MICROSOFT CORPORATION, Redmond, WA (US)

(72) Inventors: Sergey Yekhanin, Mountain View, CA (US); Huseyin Simitci, Maple Valley, WA (US); Aaron W. Ogus, Redmond, WA (US); Jin Li, Bellevue, WA (US); Cheng Huang, Redmond, WA (US); Parikshit Santhan Gopalan, Mountain View, CA (US); Bradley G. Calder, Bellevie, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/223,596

(22) Filed: Mar. 24, 2014

(65) Prior Publication Data

US 2014/0380126 A1 Dec. 25, 2014

Related U.S. Application Data

(63) Continuation-in-part of application No. 13/926,722, filed on Jun. 25, 2013.

(51) Int. Cl.
*G06F 11/00* (2006.01)
*G06F 11/10* (2006.01)

(52) U.S. Cl.
CPC ............ *G06F 11/10* (2013.01); *G06F 11/1076* (2013.01)

(58) Field of Classification Search
None
See application file for complete search history.

(56) References Cited

U.S. PATENT DOCUMENTS

| 7,904,782 B2 * | 3/2011 | Huang et al. ................. 714/752 |
| 7,930,611 B2 | 4/2011 | Huang et al. |
| 7,979,771 B2 | 7/2011 | Margolus et al. |
| 8,051,362 B2 | 11/2011 | Li et al. |
| 8,171,379 B2 * | 5/2012 | Adarshappanavar et al. 714/770 |
| 8,316,260 B1 | 11/2012 | Bonwick |
| 8,364,891 B2 | 1/2013 | Margolus et al. |
| 8,433,849 B2 | 4/2013 | De Schrijver et al. |

(Continued)

FOREIGN PATENT DOCUMENTS

WO 2012007715 A2 1/2012

OTHER PUBLICATIONS

Kermarrec, et al., "Repairing Multiple Failures with Coordinated and Adaptive Regenerating Codes", In International Symposium on Network Coding, Jul. 25, 2011, 13 pages.

(Continued)

*Primary Examiner* — Justin R Knapp
(74) *Attorney, Agent, or Firm* — Ben Tabor; Kate Drakos; Micky Minhas

(57) ABSTRACT

In various embodiments, methods and systems for erasure coding data across multiple storage zones are provided. This may be accomplished by dividing a data chunk into a plurality of sub-fragments. Each of the plurality of sub-fragments is associated with a zone. Zones comprise buildings, data centers, and geographic regions providing a storage service. A plurality of reconstruction parities is computed. Each of the plurality of reconstruction parities computed using at least one sub-fragment from the plurality of sub-fragments. The plurality of reconstruction parities comprises at least one cross-zone parity. The at least one cross-zone parity is assigned to a parity zone. The cross-zone parity provides cross-zone reconstruction of a portion of the data chunk.

20 Claims, 21 Drawing Sheets

(56) References Cited

U.S. PATENT DOCUMENTS

| | | | |
|---|---|---|---|
| 8,473,778 B2 | 6/2013 | Simitci et al. | |
| 2005/0229023 A1 | 10/2005 | Lubbers et al. | |
| 2006/0242542 A1* | 10/2006 | English et al. | 714/770 |
| 2007/0089045 A1* | 4/2007 | Corbett et al. | 714/801 |
| 2010/0094965 A1 | 4/2010 | Zuckerman et al. | |
| 2011/0029840 A1 | 2/2011 | Ozzie et al. | |
| 2012/0060072 A1 | 3/2012 | Simitci et al. | |
| 2012/0221533 A1* | 8/2012 | Burness et al. | 707/690 |
| 2012/0246547 A1 | 9/2012 | Yekharin et al. | |
| 2013/0054549 A1 | 2/2013 | Gopalan et al. | |
| 2014/0040702 A1* | 2/2014 | He et al. | 714/766 |

OTHER PUBLICATIONS

Datta, et al.,"Storage Codes: Managing Big Data with Small Overheads", Retrieved on: Aug. 21, 2013, Available at: http://sands.sce.ntu.edu.sg/CodingForNetworkedStorage/pdf/storagecodesnetcodetutorialexabs.pdf.

Non-Final Office Action dated Mar. 27, 2015 in U.S. Appl. No. 13/926,722, 7 pages.

"International Search Report & Written Opinion for PCT Patent Application No. PCT/US2014/043857", Mailed Date: Nov. 11, 2014, 11 Pages.

Second Written Opinion Issued in PCT Application No. PCT/US2014/043857, Mailed Date: May 27, 2015, 6 Pages.

Huang, et al., "Erasure Coding in Windows Azure Storage", In Proceedings of the USENIX Conference on Annual Technical Conference, Jun. 13, 2012, 12 Pages.

Speciale, Paul, "Erasure Coding Ensures Storage Durability in Environments where RAID Falls Down", Published on Aug. 10, 2011 Available at:http://www.networkworld.com/cgi-bin/mailto/x.cgi?pagetosend=/news/tech/2011/081011-erasure-coding.html&pagename=news/tech/2011/081011-erasure-coding.html&pageurl=http://www.networkworld.com/news/.

Hafner, James Lee, "Weaver Codes: Highly Fault Tolerant Erasure Codes for Storage Systems", In Proceedings of 4th USENIX Conference on File and Storage Technologies, Oct. 13, 2005, 14 pages.

Aguilera, et al., "Using Erasure Codes Efficiently for Storage in a Distributed System", In International Conference on Dependable Systems and Networks, Jun. 28, 2005, 10 pages.

Pamies-Juarez, et al., "Data Insertion & Archiving in Erasure-coding Based Large-scale Storage Systems", In 9th International Conference on Distributed Computing and Internet Technology, Feb. 5, 2013, 23 pages.

Pamies-Juarez, et al., "Decentralized Erasure Coding for Efficient Data Archival in Distributed Storage Systems", In 14th International Conference on Distributed Computing and Networking, Jan. 3, 2013, 15 pages.

Shetty, et al., "Hybrid Network-Erasure Coding Protection of MultiSource, Multi-Sink Multicast Sessions in WSNs", In Ad Hoc and Sensor Networking Symposium, Globecom, Dec. 3, 2012, 7 pages.

"International Preliminary Report on Patentability Issued in PCT Application No. PCT/US2014/043857", Mailed Date: Aug. 24, 2015, 7 Pages.

\* cited by examiner

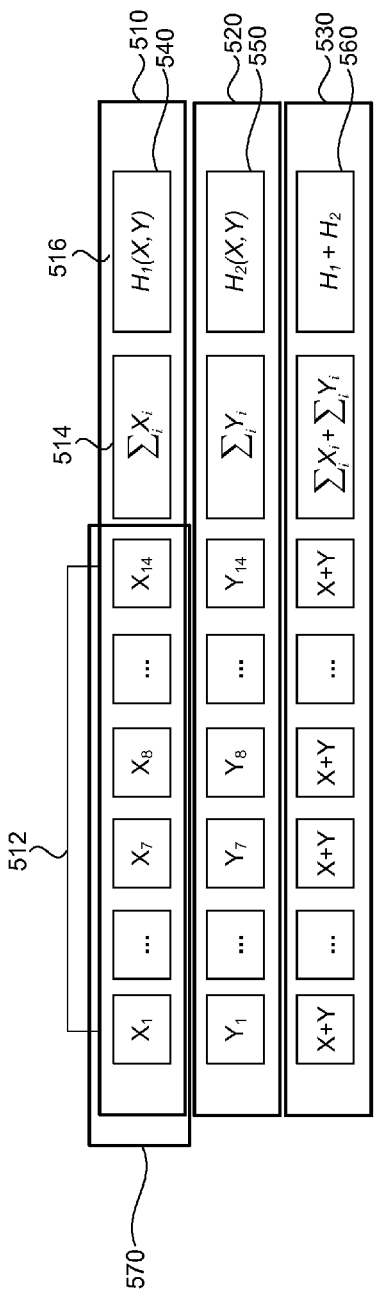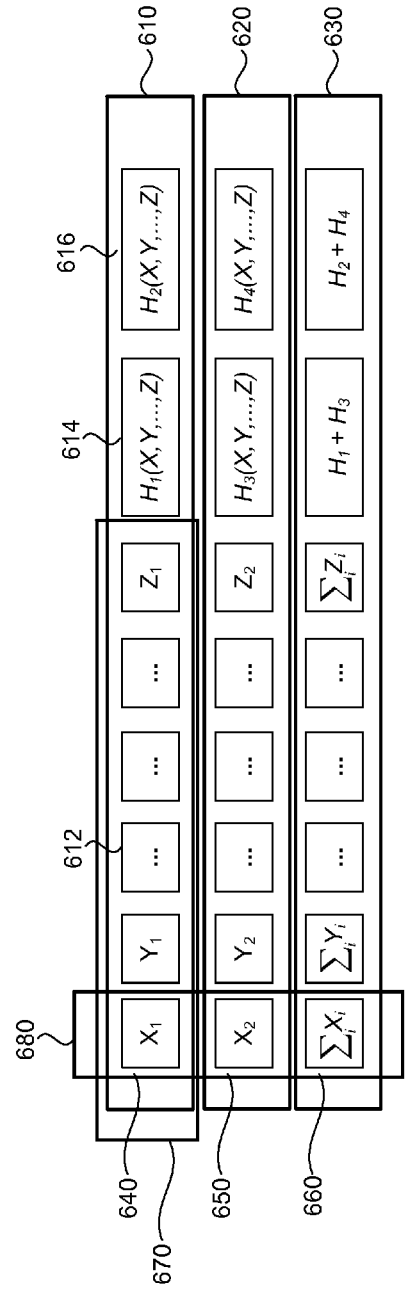

|  | STORAGE OVERHEAD | RECONSTRUCTION COST (# OF READS) | | | CROSS-ZONE BANDWIDTH |
| --- | --- | --- | --- | --- | --- |
|  |  | SINGLE FAILURE WITHIN ZONE | 2-3 FAILURES WITHIN ZONE | FULL-ZONE DISASTER |  |
| XLRC | 1.93X | 7-INTRA ZONE | 14-INTRA ZONE | 2-INTER ZONE | LOW |
| BLRC I | 1.82X | 7-INTRA ZONE | 2-INTER ZONE | 2-INTER ZONE | MODERATE |
| BLRC II | 1.71X | 14-INTRA ZONE | 2-INTER ZONE | 2-INTER ZONE | MODERATE+ |
| FRC | 1.71X | 2-INTER ZONE | 2-INTER ZONE | 2-INTER ZONE | HIGH |

FIG. 7

| XLRC | 4 | 8 | 12 | 16 | 20 |
|---|---|---|---|---|---|
| 3 | | | 2.25 | 2 | 1.87 |
| 4 | | | 2 | 1.77 | 1.66 |

Racks per Zone

| FRC | 4 | 8 | 12 | 16 | 20 |
|---|---|---|---|---|---|
| 3 | 2.4 | 1.85 | 1.71 | 1.66 | 1.62 |
| BW | 96 | 286 | 515 | 774 | 1056 |
| 4 | 1.78 | 1.52 | 1.45 | 1.42 | 1.40 |
| BW | 189 | 526 | 932 | 1388 | 1886 |

| BLRC | 4 | 8 | 12 | 16 | 20 |
|---|---|---|---|---|---|
| 3 | | 2 | 1.8 | 1.71 | 1.67 |
| BW | | 50 | 101 | 163 | 234 |
| 4 | | 1.78 | 1.6 | 1.52 | 1.48 |
| BW | | 16 | 30 | 45 | 62 |

\* Bandwidth numbers in Gbps.

FIG. 10B

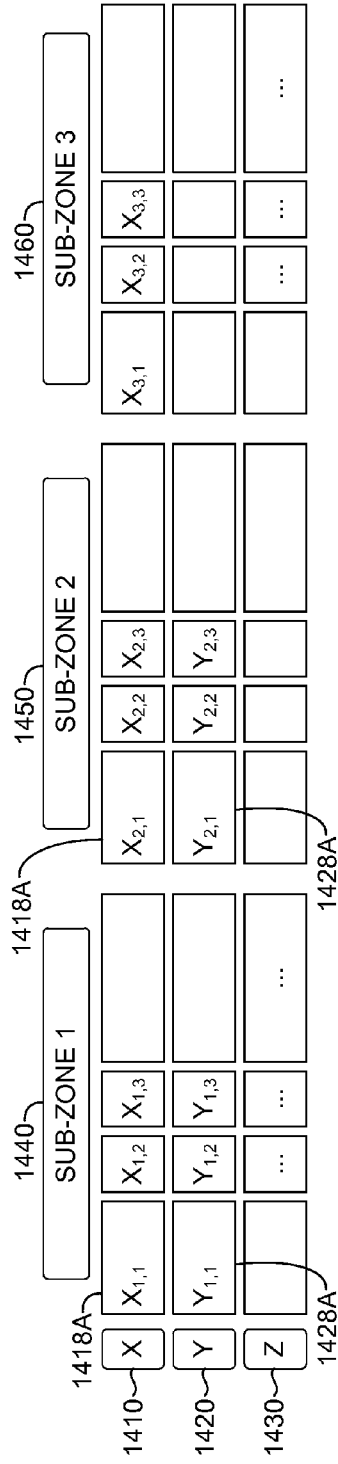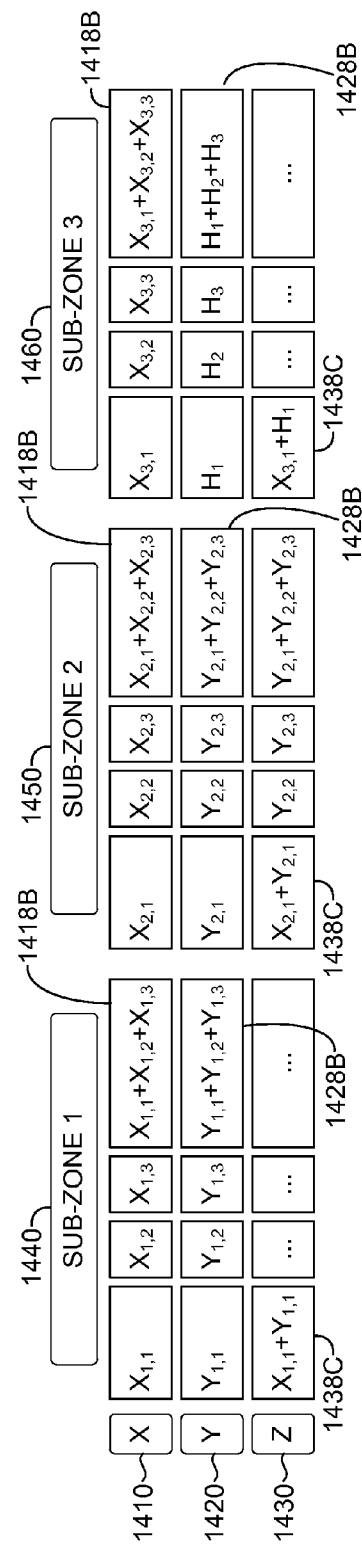

Racks per Zone (dual-corded)

| XLRC | 4 | 8 | 12 | 16 | 20 |
|---|---|---|---|---|---|
| 3 |  |  | 2.25 | 2 | 1.87 |
| 4 |  |  | 2 | 1.77 | 1.66 |

| FRC | 4 | 8 | 12 | 16 | 20 |
|---|---|---|---|---|---|
| 3 | 2.4 | 1.85 | 1.71 | 1.66 | 1.62 |
| BW | 96 | 286 | 515 | 774 | 1056 |
| 4 | 1.78 | 1.52 | 1.45 | 1.42 | 1.40 |
| BW | 189 | 526 | 932 | 1388 | 1886 |

| BLRC | 4 | 8 | 12 | 16 | 20 |
|---|---|---|---|---|---|
| 3 |  | 2 | 1.8 | 1.71 | 1.67 |
| BW | 50 | 101 | 163 | 234 |
| 4 |  | 1.78 | 1.6 | 1.52 | 1.48 |
| BW |  | 16 | 30 | 45 | 62 |

Racks per Sub-zone

| A | 4 | 8 | 12 | 16 |
|---|---|---|---|---|
| 3:3 | 3 | 2.57 | 2.45 |  |
| 4:3 | 2.66 | 2.28 | 2.18 |  |
| 4:4 | 2.37 | 2.03 | 1.93 |  |

| B | 4 | 8 | 12 | 16 |
|---|---|---|---|---|
| 3:3 | 1.71 | 1.63 |  |  |
| BW | 515 | 1359 |  |  |
| 4:3 | 1.42 | 1.29 |  |  |
| BW | 1388 | 3576 |  |  |
| 3:3 B+ | 1.8 | 1.63 |  |  |
| BW | 101 |  |  |  |

| C | 4 | 8 | 12 | 16 |
|---|---|---|---|---|
| 3:3 | 2.4 | 2.05 | 2.16 |  |
| BW | 54 | 174 |  |  |
| 4:3 | 2 | 1.71 |  |  |
| BW | 140 | 480 |  |  |
| 4:4 | 1.93 | 1.66 |  |  |
| BW | 234 | 801 |  |  |

* Bandwidth numbers in Gbps.

FIG. 15B

ERASURE CODING ACROSS MULTIPLE ZONES AND SUB-ZONES

CROSS-REFERENCE TO RELATED APPLICATIONS

This application is a continuation-in-part of U.S. patent application Ser. No. 13/926,722, filed Jun. 25, 2013, entitled "ERASURE CODING ACROSS MULTIPLE ZONES", which is herein incorporated by reference.

BACKGROUND

Data centers may use fault-tolerant storage techniques for proficient and dependable storage of data. In particular, erasure coding techniques may be employed to provide reduced storage overhead. Erasure coding may be implemented across storage nodes (e.g., disk, servers and rack). However, conventional erasure coding techniques fail to accommodate failures due to large-scale outages (e.g., a building collapsing, a data center burns down, or a weather-related damage to entire regions). And also, conventional erasure coding techniques fail to accommodate failure of levels of storage hierarchy within a data center.

SUMMARY

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

Embodiments of the present invention provide a method and system for erasure coding data across multiple storage zones. This may be accomplished by dividing a data chunk into a plurality of sub-fragments. Each of the plurality of sub-fragments is associated with a zone. Zones comprise buildings, data centers, and geographic regions providing a storage service. A plurality of reconstruction parities is computed. Each of the plurality of reconstruction parities is computed using at least one sub-fragment from the plurality of sub-fragments. The plurality of reconstruction parities comprises at least one cross-zone parity. The cross-zone parity provides cross-zone reconstruction of a portion of the data chunk. In addition, embodiments of the present invention provide a method and system for erasure coding across multiple zones based at least in part on trade-offs or dimensions of each erasure coding scheme. In particular, dimensions such as cost, performance, and reliability define implementation constraints associated with the different erasure coding scheme across zones. Each erasure coding scheme specifies the placement of erasure coded data to achieve specific goals for fault-tolerance.

Embodiments of the present invention further provide a method and system for erasure coding data across a storage hierarchy. A storage service may include a zone, as described above, which is divided into multiple subzones. Each subzone may further include multiple fault domains. A subzone or a fault domain may refer to a storage level in a data center. However, other types of storage hierarchy implementation are contemplated with embodiments of the present invention. In this regard, an exemplary storage hierarchy may include zones, subzones, and fault domains. Zones, subzones, and fault domains may be part of a hierarchical storage service that provides fault tolerance. Other types of computing components and combinations thereof, beyond storage components, are contemplated within a fault tolerance hierarchy.

Erasure coding schemes in embodiments of the present invention may be implemented to ensure fault tolerance across storage levels of a storage hierarchy, for example, all three levels disclosed above. This may be accomplished by different types of schemes that encode the data fragments within sub-zones of each zone based on different types of erasure codes, and further compute reconstruction parities across the zones. Each storage hierarchy erasure coding scheme strikes different trade-offs between storage overhead, reconstruction cost, and durability.

BRIEF DESCRIPTION OF THE DRAWINGS

The present invention is described in detail below with reference to the attached drawing figures, wherein:

FIG. 5 is a schematic diagram showing an exemplary erasure coding scheme in accordance with embodiments of the present invention;

FIG. 6 is a schematic diagram showing an exemplary erasure coding scheme in accordance with embodiments of the present invention;

FIG. 7 is a chart comparing implementation constraints of erasure coding schemes in accordance with embodiments of the present invention;

FIG. 10B is a chart comparing implementation constraints of erasure coding schemes in accordance with embodiments of the present invention;

FIG. 14A is a schematic diagram showing an exemplary erasure coding scheme in accordance with embodiments of the present invention;

FIG. 14B is a schematic diagram showing an exemplary erasure coding scheme in accordance with embodiments of the present invention;

FIG. 15B is a chart comparing implementation constraints of erasure coding schemes in accordance with embodiments of the present invention;

DETAILED DESCRIPTION

Figure 1:
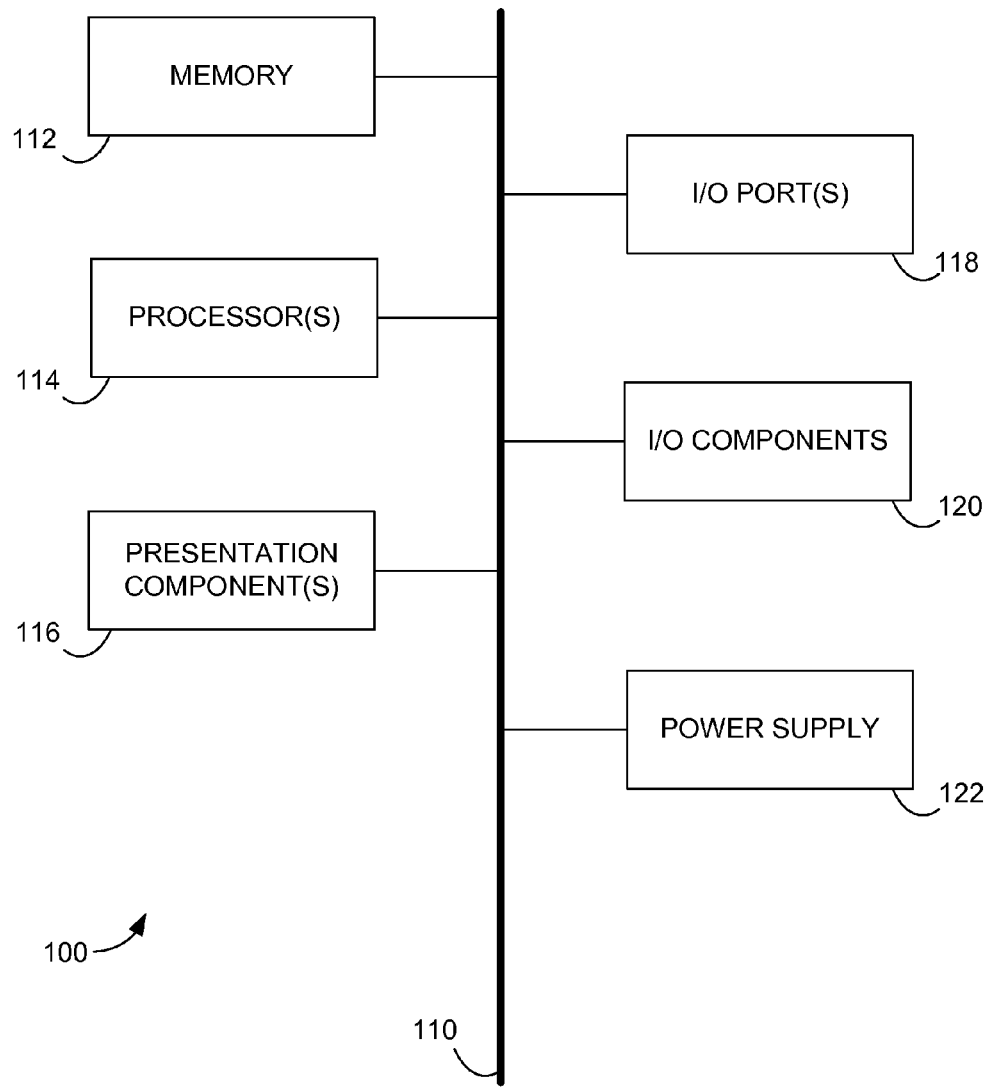
FIG. 1 is a block diagram of an exemplary computing environment suitable for use in implementing embodiments of the present invention.

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

For purposes of this disclosure, the word "including" has the same broad meaning as the word "comprising." In addition, words such as "a" and "an," unless otherwise indicated to the contrary, include the plural as well as the singular. Thus, for example, the requirement of "a feature" is satisfied where one or more features are present. Also, the term "or" includes the conjunctive, the disjunctive and both (a or b thus includes either a or b, as well as a and b).

For purposes of a detailed discussion below, embodiments of the present invention are described with reference to erasure coding data across multiple zones based on erasure coding schemes that are schematically depicted for three zones; however the three zones depicted herein are merely exemplary and it is contemplated that a plurality of zones may be utilized with erasure coding schemes described herein. Also, for purposes of a detailed discussion below, embodiments of the present invention are described with reference to erasure coding data of a storage hierarchy based on erasure coding schemes that are schematically depicted for three storage level zones; however the three storage level zones depicted herein are merely exemplary and it is contemplated that a plurality of storage level zones with fault tolerance for other types of computing components may be utilized with erasure coding schemes described herein. Further, while embodiments of the present invention may generally refer to the distributed storage system and the schematics described herein, it is understood that the techniques described may be extended to other implementation contexts.

Generally, fault-tolerance refers to the capacity for a system to continue operating in the event of the failure of (or one or more faults) some of its components. For example, fault-tolerance techniques include replication and erasure coding. Erasure coding refers to error correction algorithms that function to recover from failures of stored data. Data may be stored in different types of storage hardware with different types of storage services. Erasure coding may be implemented to provide fault-tolerance for stored data. In addition, erasure coding may also provide reduced storage overhead. For example, instead of replicating a stream of data, the data may be divided into segments and associated with one or more parities and then the segments are stored with the ability to reconstruct missing segments from remaining segments. As such, erasure coding provides cost savings in hardware, data center footprint, and power savings from not having to run the additional hardware.

Erasure coding data across zones (e.g., data centers, buildings or regions), however, comes with trade-offs or dimensions, discussed in more detail below. For example, cost, performance, and reliability having specific implementation constraints when encoding data and recovering data from failures of erasure coded data across multiple storage zones and also storage levels within a hierarchical storage. These trade-offs may be associated with different erasure coding schemes, especially when erasure coding is performed for data stored in different zones and storage levels.

Generally, erasure code encodes data using particular types of code. For example, Reed-Solomon is a conventional approach for erasure coding data. A Reed-Solomon implementation may include 6 data fragments and 3 code (parity) fragments for recovering the 6 data fragments. Another type of erasure coding is Local Reconstruction Codes (LRC). Compared to Reed-Solomon, LRC reduces the number of erasure coding fragments that need to be read when reconstructing data fragments that are offline, while keeping storage overhead low. For example, with 6 data fragments, LRC generates 4 parity fragments instead of 3. Two local parity fragments, each associated with different sets of 3 data fragments out of the 6 fragments and two global parity fragments for the 6 data fragments. So in contrast to Reed-Solomon that uses a parity and 5 data fragments to reconstruct a failed data fragment, LRC uses a local parity and 2 data fragments in the same set to reconstruct the failed data fragment. LRC provides more flexibility than Reed-Solomon in balancing storage overhead vs. reconstruction cost. For the above example, LRC adds one more parity than Reed-Solomon, while reducing reconstruction cost by half. Alternatively, LRC can keep the same reconstruction cost as Reed-Solomon while reducing the storage overhead significantly.

Local Reconstruction Codes may be formally defined. A (k, l, r) LRC divides k data fragments into l groups, with k/l data fragments in each group. The erasure coding scheme computes one local parity within each group. In addition, it computes r global parities from all the data fragments. Let n be the total number of fragments (data+parity). Then n=k+l+r. Thus, the normalized storage overhead is n/k=1+(l+r)/k. The LRC in this example is a (6, 2, 2) LRC with storage cost of 1+4/6=1.67x.

Further, LRC codes may be determined based on coding equations chosen such that the LRC achieves a maximally recoverable (MR) property, which means it can decode any failure pattern which is information-theoretically decodable. For example, with reference to the example above, if a set of 3 data fragments and the parity associated with the data fragments fail, the pattern is non-decodable because the remaining two parities cannot decode the 3 data fragments, thus it information-theoretically non-decodable. Otherwise, failure patterns that are possible to reconstruct are called information-theoretically decodable. An LRC may be associated with single set of coding equations that achieve maximally recoverable property.

Embodiments of the present invention provide fault-tolerance for large-scale outages while ensuring reliability and availability based on erasure coding data across multiple storage zones. Zones refer to particular buildings, data centers, and geographic regions providing a storage service. Erasure coding across multiple zones encompasses providing erasure coding at any level of fault tolerance defined by a storage service in the zone. As such, implementing erasure coding across zones creates a different set of implementation considerations and opportunities. In particular, erasure coding across zones may be optimized based on unique cross zone characteristics such as bandwidth between zones, in that bandwidth between zones is much more scarce and expensive than within a zone. Also, the likelihood of zone failure is a relevant factor. Basically, it is much less probable that an entire zone may fail than a storage node. It is expected that a zone will fail, or zones may be taken offline for maintenance. This allows for zones to be built much cheaper than traditional data centers providing significant cost savings for a storage service.

Due to the cross-zone characteristics involved, zones introduce a variety of trade-offs in implementing erasure coding of data across zones depending on the goals of the zones. Trade-offs refer to erasure coding scheme dimensions such as cost, performance, and reliability that define implementation constraints associated with different erasure coding schemes. Each erasure coding scheme specifies the placement of erasure coded data to achieve specific goals for fault-tolerance. As such, erasure coding may be implemented with a combination of goals that include: minimization of overhead/cross-zone bandwidth consumption, maximization of performance, while maintaining desired durability.

Exemplary erasure coding schemes include a first erasure coding scheme (e.g., XLRC) that may provide local reconstruction within a zone and fault-tolerance across zones using LRC and conventional erasure coding schemes. A second erasure coding scheme (e.g., BLRC) that may provide both local reconstruction within a zone and fault-tolerance across zones by jointly choosing coding coefficients within a zone and across zones. And a third erasure coding scheme that may achieve high storage efficiency while providing fault tolerance across zones by trading cross-zone network bandwidth for storage efficiency.

Three dimensions may be associated with fault-tolerant data storage across zones. They include: cost (e.g., minimization of overhead/cross-zone bandwidth consumption), performance (e.g., maximization of performance) and reliability (e.g., offline durability). Cost is a metric associated with a distributed storage system across multiple zones. The distributed storage system may include several sub-storage systems each within a single zone. Each of the sub-systems may be linked together by a network backbone spanning across the zones. In this regard, total cost may be determined based on a single-zone sub-storage system and cross-zone network backbone. The single-zone sub-storage system may be a function of the storage overhead—the total amount of physical storage space required to store a specified amount of user data. The cross-zone network backbone may be a function of the amount of network bandwidth to be provisioned to support the storage system.

The performance metric may refer to the ability to recover from different types of failure scenarios. Different types of failures have different impacts on system performance. Each type of failure may be treated differently. For example, when a storage node or a fault domain within a zone fails, the system runs in a degraded mode. However, when an entire zone fails, the system runs in a disaster mode. In order to characterize performance, for example, in a degraded mode, a degraded read cost (i.e., the number of disk I/Os required to read one unit of user data from failed storage node) may be defined. Similarly a disaster read cost may be define as the number of disk I/Os required to read one unit of user data that was in a failed zone. Disk I/Os are contemplated to include network transfer costs for communicating data. Further, reliability is associated with types of failures and quantities of failures that can be tolerated by a data storage system. Thus, reliability is based upon the ability to reconstruct data after one or more machines fails or becomes unavailable. For example, reliability may be evaluated based on a Mean Time to Data Loss (MTTDL).

Particular coding schemes may include, the XOR-LRC or XLRC scheme employs two types of erasure codes. The LRC within each zone and an XOR (exclusive OR) across all zones. LRC provides recovery of data fragments for arbitrary (r+1) and up to (r+l) failures within a single zone without cross-zone recovery. Using a three-zone deployment as an example, with XLRC, a data chunk is divided into sub-fragments evenly between two zones. Within each zone, the sub-fragments are protected by a number of local parities and zone parities. The local parities are generated from the sub-fragments in each zone and enable efficient failure reconstruction within the zone. The zone parities are generated from the all the sub-fragments in each zone and provide maximum fault-tolerance. As discussed, maximum tolerance comprises an LRC that achieves the Maximally Recoverable property using specifically determined coding equations; which means the LRC may decode any failure pattern which is information-theoretically decodable. The sub-fragments of the zones, the local parities, and the zone parities combined form an LRC. A zone fragment (data or parity) from each of the two zones is used to compute a cross-zone parity by XORing the zone fragments. The cross-zone parity is assigned to a third zone (e.g., a parity zone). Cross-zone parities are computed for all zone fragments, including data fragments, local and zone parities. In this regard, the third zone contains three types of cross-zone parties, those for XORing the zone data-fragments, XORing the local parities, and XORing the zone parities.

The LRC and XOR are linear computations. Due to the commutative property of linear computations, the XOR sum of parities are parities of individual XOR sums. Thus, the three types of cross-zone parities assigned to the third zone also form an LRC within the third zone. As such, all failures within the third zone may be reconstructed from fragments within the zone. In addition, following the property of LRC, single failure in the zone may be efficiently reconstructed.

In XLRC, reconstruction due to storage failure may be completed using zone data-fragments within the same zone. Thus, in a degraded mode, the reconstruction network traffic may be contained within each zone without cost to the cross-zone network backbone. In scenarios where an entire zone fails, the cross-zone redundancy may be invoked for disaster recovery. However, even in disaster mode, additional storage nodes failures in any remaining node may still be reconstructed within the zone. XLRC provides minimal stress on the cross-zone backbone and implements limited provisions from the cross-zone backbone. The XLRC coding scheme provides cross-zone redundancy using cross-zone parity. For example, in disaster mode, when an entire zone fails, cross-zone redundancy may be eliminated and redundancy may be provided only within each zone. In this regard, in order to provide against data loss even when the disaster mode lasts for a sustained period, the parameters of the LRC need to ensure durability within each zone is particularly high. Thus, XLRC provides significant durability within each zone.

Using a three-zone deployment as an example, XLRC codes may be formally defined. A $(3, 1)$-$(k, l, r)$ XLRC consists of n fragments in each data center, where $n=k+l+r$. Let $c\_\{i, j\}$ denote the j^th fragment in data center i, where $j=0, 1, \ldots, n-1$ and $i=0, 1, 2$. We have $c\_\{0, j\}$ and $c\_\{1, j\}$, where $j=0, 1, \ldots, k-1$, as data fragments. We also have the remaining fragments as parities. The parity fragments satisfy the following constraints: cross-zone party constraint, local parity constraint, and intra-zone parity constraint formally denoted as:

$c\_\{2, j\}=c\_\{0, j\}+c\_\{1, j\}$—cross-zone parity constraint;

$c\_\{i, k+l\_j\}=\sum\_\{j=l\_j*k/l\}^\{(l\_j+1)*k/l-1\}c\_\{i, j\}$, $l\_j=0, 1, \ldots, l-1$—local parity constraint; and $c\_\{i, k+r\_i\}=\sum\_\{j=0\}^\{r-1\} \alpha\_\{j, r\_i\}c\_\{i, j\}$// $r\_i=0, 1, \ldots, r-1$—intra-zone parity constraint.

The storage overhead of XLRC is $3n/2k$. The degraded read cost is $k/l$ fragments within the zone. The disaster read cost is 2 fragments across zones.

The Balance Location Reconstruction Code (BLRC) erasure code scheme supports a flexible balance between storage overhead and cross-zone network traffic. The BLRC scheme utilizes more cross-zone network provisions. The BLRC scheme also maintains lower storage overhead. Structurally, the BLRC replaces zone parities which protect zone data-fragments within a zone, with inter-zone parity, which protects data fragments across all zones. The alteration makes it possible to lower the durability of each zone in that in the event of an entire zone failure, zone data-fragments are protected by inter-zone parities not only in the same zone, but also in other surviving zones.

As distinguished from XLRC, where two classes of codes are applied independently, BLRC jointly designs the parities within and across the zones. The BLRC scheme provides additional fault tolerance without incurring extra storage overhead. In operation, a data chunk is divided into sub-fragments evenly among zones. Within each zone, the sub-fragments are protected by local parities. The local parities are computed from the sub-fragments in each zone to enable efficient failure construction. A number of inter-zone parities are computed from all the sub-fragments of each zone. The inter-zone parities provide maximum fault-tolerance across zones. This is a distinguishing feature between the BLRC and the XLRC. A zone fragment from each of the zones is used to compute a cross-zone parity by XORing the fragments. The cross-zone parities are generated for all zone data-fragments in each zone, including data fragments, local and inter-zone parities. The third zone contains three types of cross-zone parities, from XORing zone data-fragments, XORing local parities and XORing inter-zone parities.

Similar to the XLRC, following the commutative property, it is possible to reconstruct failure in the third zone locally. In BLRC, single failure of zone data-fragments or local parity may be reconstructed using other fragments within the same zone. As such, the reconstruction traffic due to single storage node failure is mostly contained within each zone. However, the failure of an inter-zone parity or multiple zone data-fragments may have to be reconstructed across zones. Such reconstruction taxes the cross-zone network backbone. The cross-zone network backbone requires more provisions, in addition to the capacity for disaster recovery. Further, the BLRC inter-zone parities provide final cross-zone redundancy even in the disaster mode when an entire zone fails. This may allow the BLRC to achieve higher storage efficiency that the XLRC while maintaining comparable durability.

Using a three-zone deployment as an example, BLRC codes may be formally defined. A $(3, 1)$-$(k, l, g)$ BLRC consists of n fragments in each data center, where $n=k+l+g$. Let $c\_\{i, j\}$ denote the j^th fragment in data center i, where $j=0, 1, \ldots, n-1$ and $i=0, 1, 2$. We have $c\_\{0, j\}$ and $c\_\{1, j\}$, where $j=0, 1, k-1$, as data fragments. We also have the remaining fragments as parities. The parity fragments satisfy the following constraints: cross-zone parity constraint, local parity constraint, and inter-zone parity constraint, formally denoted as:

$c\_\{2, j\}=c\_\{0, j\}+c\_\{1, j\}$—cross-zone parity constraint;

$c\_\{i, k+l\_j\}=\sum\_\{j=l\_j*k/l\}^\{(l\_j+1)*k/l\}c\_\{i, j\}$, $l\_j=0, 1, \ldots, l-1$—local parity constraint; and $c\_\{i, k+g\_i\}=\sum\_\{i=0\}^\{1\}\sum\_\{j=0\}^\{r-1\}\alpha\_\{i, j, g\_i\}c\_\{i, j\}//g\_i=0, 1, \ldots, g-1$—inter-zone parity constraint.

The storage overhead of BLRC is $3n/2k$. The degraded read cost is $k/l$ fragments within zone. The disaster read cost is 2 fragments across zones.

In the third erasure coding scheme, the Frugal Reconstruction Code (FRC) achieves the highest storage efficiency, compared to XLRC and BLRC. The storage efficiency however comes at the cost of the largest cross-zone traffic. Structurally, the FRC is derived from the BLRC by removing all local parities. Even though related to the BLRC, the FRC by removing local parities provides for a different type of fault-tolerance in that portions of the data chunk have to be reconstructed across zones. As such, the cross-zone network backbone is heavily utilized while allowing the FRC to achieve the highest storage efficiency.

Using a three-zone deployment as an example, FRC codes may be formally defined. A $(3, 1)$-$(k, g)$ FRC consists of n fragments in each data center, where $n=k+g$. Let $c\_\{i, j\}$ denote the j^th fragment in data center i, where $j=0, 1, \ldots, n-1$ and $i=0, 1, 2$. We have $c\_\{0, j\}$ and $c\_\{1, j\}$, where $j=0, 1, \ldots, k-1$, as data fragments. We also have the remaining fragments as parities. The parity fragments satisfy the following constraints: cross-zone party constraint and inter-zone parity constraint, formally denoted as:

$c\_\{2, j\}=c\_\{0, j\}+c\_\{1, j\}$—cross-zone parity constraint; and $c\_\{i, k+g\_i\}=\sum\_\{i=0\}^\{1\}\sum\_\{j=0\}^\{r-1\}\alpha\_\{i, j, g\_i\}c\_\{i, j\}//g\_i=0, 1, \ldots, g-1$—inter-zone parity constraint.

The storage overhead of FRC is $3n/2k$. Both the degraded read cost and the disaster read cost is 2 fragments across zones.

As discussed above, implementing erasure coding may be accomplished using plurality of erasure coding schemes, each with implementation constraints; each of the schemes may be selected based on implementation constraints to achieve particular goals of the zones.

Accordingly, in a first aspect of the present invention, one or more computer-readable media storing computer-useable instructions that, when used by one or more computing devices, cause the one or more computing devices to perform a method for erasure encoding data across multiple storage zones. The method includes dividing a data chunk into a plurality of sub-fragments, each of the plurality of sub-fragments associated with one of a plurality of zones. The method also includes computing a plurality of reconstruction parities, each of the plurality of reconstruction parities computed using at least one sub-fragment from the plurality of sub-fragments. The plurality of reconstruction parities comprises at least one cross-zone parity. The method further assigning the at least one cross-zone parity to a parity zone, wherein the cross-zone parity provides cross-zone reconstruction of a portion of the data chunk.

In a second aspect of the present invention, a system for erasure coding data across multiple storage zone. The system includes dividing a data chunk into a plurality of sub-fragments, each of the plurality of sub-fragments having one or more zone data-fragments, each of the plurality of sub-fragments is associated with one of a plurality of zones. The encoder component is also configured for computing a plurality of reconstruction parities, each of the plurality of reconstruction parities computed using at least one sub-fragment from the plurality of sub-fragments. The plurality of reconstruction parities comprises at least one cross-zone parity. The encoder component is further configured for: assigning the at least one cross-zone parity to a parity zone, wherein the cross-zone parity provides cross-zone reconstruction of a portion of the data chunk. The system also includes a reconstruction component configured for: reconstructing data using the plurality of sub-fragments and the plurality of reconstruction parities, associated with the first zone, the second zone, and the third zone. The data is reconstructed based on an erasure coding scheme of the data, and recovering data for a first erasure coding scheme comprises: providing local reconstruction within a recovery zone and maximum fault-tolerance across zones using local parities and zone parities; for a second erasure coding scheme comprises: providing local reconstruction within the recovery zone and maximum fault-tolerance across zones using local parities and inter-zone parities; and for a third erasure coding scheme comprises: providing maximum fault-tolerance across zones using inter-zone parities.

In a third aspect of the present invention, a computer-implemented method for selecting an erasure coding scheme for encoding data chunks across multiple storage zones. The method includes providing a plurality of erasure coding schemes. Each of the plurality of erasure coding schemes is associated with a plurality of dimensions that define implementation constraints. The method also includes selecting an erasure coding scheme for encoding a data chunk based at least in part on the plurality of dimensions. The method also encoding the data chunk using the erasure coding scheme selected, the erasure coding scheme divides the data chunk into a plurality of sub-fragments in one or more groups in a selected zone from the plurality of zones, each of the one or more groups comprising one or more zone data-fragments in the selected zone.

A first selected erasure coding scheme is configured for, for each zone of the plurality of zones: computing in a horizontal direction a plurality local parities for each of the one or more groups in the zone from a subset zone data-fragments in each of the one or more groups in the zone; computing in the horizontal direction a plurality of zone parities from the one or more zone data-fragments of the zone; and computing in the vertical direction a plurality of cross-zone parities using a plurality zone fragments comprising the one or more zone data-fragments, the plurality of local parities, and the plurality of zone parities vertically corresponding in each of the plurality of zones, wherein the plurality of cross-zone parities are assigned to a parity zone. The plurality of cross-zone parities are assigned to a corresponding position in the parity zone.

A second selected erasure coding scheme is configured for, for each zone of the plurality of zones: computing in the horizontal direction local parities for each of the one or more groups in the zone from a subset zone data-fragments in each of the one or more groups; computing in the horizontal direction an inter-zone parity from the one or more zone data-fragments in each of the plurality of zones; and computing in the vertical direction a plurality of cross-zone parities using a plurality of zone fragments comprising the one or more zone data-fragments, the plurality of local parities, and the inter-zone parity vertically corresponding in each of the plurality of zones. The plurality of cross-zone parities are assigned to a corresponding position the parity zone.

A third erasure coding scheme is configured for: for each zone from the plurality of zones: computing in a horizontal direction a plurality of inter-zone parities from the one or more zone data-fragments in each of the plurality of zones; computing in a vertical direction a plurality of cross-zone parities using a plurality of zone fragments comprising the one or more zone data-fragments and the plurality of inter-zone parities vertically corresponding in each of the plurality of zones, wherein the plurality of cross-zone parities are assigned to the parity zone. The plurality of cross-zone parities are assigned a corresponding position in the parity zone.

Embodiments of the present invention further provide a method and system for erasure coding data across a storage hierarchy. A storage service may include a zone, as described above, which is divided into multiple subzones. Each subzone may further include multiple fault domains. A subzone or fault domain may refer to a storage level in a data center. In this regard, an exemplary storage hierarchy may include zones, subzones, and fault domains. Zones, subzones, and fault domains may be part of a defined hierarchical storage service that provides fault tolerance. Erasure coding schemes in embodiments of the present invention may be implemented to ensure fault tolerance across storage levels of a storage hierarchy, for example, all three levels disclosed above. Each storage hierarchy erasure coding scheme strikes different trade-offs between storage overhead, reconstruction cost, and durability.

In operation, a first coding scheme ("scheme A") employs two separate erasure codes. FRC is implemented across multiple subzones of the same zone and an XOR (exclusive OR) across all zones. Using a three zone deployment as an example, let X, Y, and Z denote the three availability zones ("AZ"). Let the fault domains ("FD") and subzones ("SZ") of each zone form a two-dimensional grid where each column represents a subzone and each cell represents a fault domain. Let $x_{\{i,j\}}$ represent a fragment stored in the $i^{\{th\}}$ FD in the $j^{\{th\}}$ SZ (represented as the cell in the $i^{\{th\}}$ row and the $j^{\{th\}}$ column in the grid). Define $y_{\{i,j\}}$ and $z_{\{i,j\}}$ similarly. Denote r as the number of FDs in each SZ. There are $r*3*3=9r$ fragments in total. Among the 9r total fragments, there are $4(r-1)$ data fragments, which are $x_{\{i,j\}}$ and $y_{\{i,j\}}$ with $i=1, \ldots, r-1$ and $j=1, 2$. The storage overhead is $9r/(4(r-1))$. Apply FRC to the fragments in X and generate parities as follows:

$x_{\{i,3\}}=x_{\{i,1\}}+x_{\{i,2\}}$—local parity;

$x_{\{r,1\}}=H\_1(x_{\{i,j\}}, i=1, \ldots, r-1, j=1, 2)$—$1^{st}$ zone parity;

$x_{\{r,2\}}=H\_2(x_{\{i,j\}}, i=1, \ldots, r-1, j=1, 2)$—$2^{nd}$ zone parity;

The data fragments and the zone parities are placed in a first and a second SZ, while the local parities are placed in a third SZ, or parity zone. Parities in Y are generated and placed similarly. All fragments in Z are parities and generated using cross-AZ XOR as following:

$z\_\{i, j\} = x\_\{i, j\} + y\_\{i, j\}$—fragments in Z parities;

Following the distributive property of linear computation, the fragments in Z also form FRC, where the XORs of the data fragments from X and Y can be regarded as "data fragments" in the FRC, the XORs of the local parities from X and Y can be regarded as "local parities" in the FRC, and the XORs of the zone parities can be regarded as "zone parities" in the FRC.

Scheme A achieves high durability. Scheme A also tolerates any single AZ failure. Even after an AZ failure, each of the remaining AZs can still tolerate the failure of any single SZ and two additional FDs. Scheme A further offers efficient reconstruction. Multiple FD failures, being the most common, can be completely reconstructed within AZ. In addition, even less common SZ failures can be completely reconstructed within AZ. After an AZ failure, cross-AZ network may be used for reconstruction. Hence, scheme A may not demand high cross-AZ network bandwidth.

In an alternate embodiment of scheme A, scheme A may reduce the number of zone parities in each AZ and substitute the zone parities with data fragments. For example, instead of two zone parities, X and Y, each, only contains a single zone parity. In this case, instead of 2r data fragments, X and Y each contains (2r+1) data fragments. Further, an alternate embodiment of scheme A replaces the zone parities in X and Y with global parities that may be generated from all the data fragments in both X and Y. Compared to the initial embodiment of scheme A, both variations achieve slightly different trade-offs among storage overhead, reconstruction cost and durability.

A second scheme ("scheme B") employs single FRC across multiple SZs and multiple AZs, but placed particularly to tolerate correlated simultaneous SZ failures across the AZs. For example, with 3 AZs, 3 SZs per AZ and 4 FDs per SZ. Scheme B inherits all the properties of FRC. Given the example, any single AZ failure may be tolerated. Even after an AZ failure, up to 3 additional FD failures can be tolerated. Single SZ failure is treated the same as the failure of the entire AZ containing the SZ and thus is naturally tolerated.

Further, the special property of scheme B is that Scheme B tolerates correlated simultaneous failure of 3 SZs. The 3 SZs which may fail simultaneously. Scheme B tolerates simultaneous failure of 3 SZs. Even after simultaneous failure of 3 SZs, scheme B additionally tolerates up to 3 FD failures. In practice, the correlated SZ failures could happen due to common power supplies. For example, there are 3 independent power supplies to the 3 AZs, where each power supply is connected to 3 SZs—one SZ from each AZ. Hence, the failure of any single power supply would cause the 3 SZs connected to the power supply to fail simultaneously.

The third scheme ("scheme C") employs two separate erasure codes. BLRC and simple XOR (exclusive OR), across multiple AZs. Scheme C also employs a special placement to tolerate SZ failures. Using a three zone deployment as an example, let X, Y, and Z denote the three availability zones ("AZ"). Each AZ contains 3 SZs. Let $x\_\{i, j\}$ represent a fragment stored in the $j^\{th\}$ FD in the $i^\{th\}$ SZ in X. Define $y\_\{i, j\}$ and $z\_\{i, j\}$ similarly. Denote r as the number of FDs in each SZ (r=4). There are r*3*3=9r fragments in total. Among the 9r total fragments, there are 5(r−1) data fragments, which are $x\_\{i, j\}$ with i=1, 2, 3 and j=1, r−1 and $y\_\{i, j\}$ with i=1, 2, and j=1, . . . , r−1. The storage overhead is 9r/(5(r−1)). BLRC is applied to the fragments in X and Y; in this implementation, BLRC is applied across X and Y, but not Z. The BLRC local parities are placed in each SZ and generated as follows:

$x\_\{i, r\} = x\_\{i, 1\} + x\_\{i, 2\} + \ldots + x\_\{i, r-1\}$;

The BLRC inter-zone parities are placed in SZ 3 in Y and generated as follows:

$y\_\{3, j\} = H\_j(x\_\{i, j\}, i=1, 2, 3; y\_\{i, j\}, i=1, 2)$;

For instance, $y\_\{3, 1\} = H\_1(x\_\{1, 1\}, x\_\{2, 1\}, x\_\{3, 1\}, y\_\{1, 1\}, y\_\{2, 1\})$.

All fragments in Z are parities and generated using cross-AZ XOR as following:

$z\_\{i, j\} = x\_\{i, j\} + y\_\{i, j\}$;

Following the commutative property of linear computation, the $r^\{th\}$ fragment in each SZ in Z is linear combination of the other fragments in the same SZ and is used for efficient reconstruction within SZ.

Scheme C properties include, tolerating simultaneous failure of one AZ, one SZ and one FD. Scheme C also offers efficient reconstruction. Single FD failure, being the most common case, can be reconstructed within SZ. Reconstruction within SZ may not require network bandwidth across-SZ and can be even more efficient than reconstruction within AZ (as in scheme A). On the other hand, failures beyond single FD may require across-AZ network for reconstruction. Hence, scheme C demands more cross-AZ network provision than scheme A.

An alternate embodiment of scheme C comprises replacing BLRC with FRC. Instead of BLRC, this implementation of scheme C applies FRC across X and Y, where the FRC global parities are placed in SZ 3 in Y and generated from all the data fragments from both X and Y. This storage overhead remains the same, while higher durability is achieved at the cost of higher reconstruction cost beyond single FD failure.

As discussed above, implementing erasure coding across a storage hierarchy may be accomplished using plurality of erasure coding schemes, each with implementation constraints; each of the schemes may be selected based on implementation constraints to achieve particular goals of the zones.

Accordingly, in a fourth aspect of the present invention, one or more computer storage media storing computer-useable instructions that, when used by one or more computing devices, cause the one or more computing devices to perform a method for erasure encoding data across multiple storage zones are provided. The method includes dividing data into two or more data chunks, the two or more data chunks corresponding to two or more zones. For a given zone of the two or more zones, the method includes dividing a data chunk corresponding to a zone, into a plurality of sub-fragments, each of the plurality sub-fragments associated with one of a plurality sub-zones. The method further includes computing a plurality of reconstruction parities using the plurality of sub-fragments. The method also includes computing a plurality of cross-zone parities based on an exclusive-or using the plurality of sub-fragments and the plurality of reconstruction parities in the two or more zones. The plurality of sub-fragments and the plurality of reconstruction parities are correspond across the two or more zones. The method also includes assigning the plurality of cross-zone parities to a parity zone. The plurality of cross-zone parities provide at least cross-zone reconstruction of a portion of the data.

In a fifth aspect of the present invention, one or more computer storage media storing computer-useable instructions that, when used by one or more computing devices, cause the one or more computing devices to perform a method for erasure encoding data across multiple storage zones are provided. The method includes dividing data into two or more data chunks, the two or more data chunks corresponding to two or more zones. For a given zone in the two or more zones: the method includes dividing a data chunk corresponding to a zone, into a plurality of sub-fragments, each of the plurality sub-fragments associated with one of a plurality non-correlated sub-zones. The method further includes assigning correlated sub-zones to one or more subsets of the plurality of sub-fragments. The method includes computing at least one intra-zone reconstruction parity using the plurality of sub-fragments in the plurality of non-correlated sub-zones. The method includes computing a plurality of cross-zone parities using the plurality of sub-fragments and the at least one intra-zone reconstruction parity in the two or more zones. The plurality of sub-fragments and the at least one intra-zone reconstruction parity correspond across the two or more zones. The method also includes assigning the plurality of cross-zone parities to a parity zone. The plurality of cross-zone parities provide at least cross-zone reconstruction of a portion of the data.

In a sixth aspect of the present invention, one or more computer storage media storing computer-useable instructions that, when used by one or more computing devices, cause the one or more computing devices to perform a method for erasure encoding data across multiple storage zones are provided. The method includes dividing data into two or more data chunks, the two or more data chunks corresponding to two or more zones. For a given zone in the two or more zones: the method includes dividing a data chunk corresponding to a zone, into a plurality of sub-fragments, each of the plurality sub-fragments associated with one of a plurality sub-zones. The method also includes computing a plurality of reconstruction parities using the plurality of sub-fragments. The plurality of reconstruction parities include at least one intra-sub-zone reconstruction parity. The method further includes computing a plurality of cross-zone parities using the plurality of sub-fragments and the at least one intra-sub-zone reconstruction parity in the two or more zones. The method also includes assigning the plurality of cross-zone parities to a parity zone, wherein the plurality of cross-zone parities provide at least cross-zone reconstruction of a portion of the data.

Having briefly described an overview of embodiments of the present invention, an exemplary operating environment in which embodiments of the present invention may be implemented is described below in order to provide a general context for various aspects of the present invention. Referring initially to FIG. 1 in particular, an exemplary operating environment for implementing embodiments of the present invention is shown and designated generally as computing device 100. Computing device 100 is but one example of a suitable computing environment and is not intended to suggest any limitation as to the scope of use or functionality of the invention. Neither should the computing device 100 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

With reference to FIG. 1, computing device 100 includes a bus 110 that directly or indirectly couples the following devices: memory 112, one or more processors 114, one or more presentation components 116, input/output ports 118, input/output components 120, and an illustrative power supply 122. Bus 110 represents what may be one or more busses (such as an address bus, data bus, or combination thereof). Although the various blocks of FIG. 1 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. We recognize that such is the nature of the art, and reiterate that the diagram of FIG. 1 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 1 and reference to "computing device."

Computing device 100 typically includes a variety of computer-readable media. Computer-readable media can be any available media that can be accessed by computing device 100 and includes both volatile and nonvolatile media, removable and non-removable media. By way of example, and not limitation, computer-readable media may comprise computer storage media and communication media.

Computer storage media include volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 100. Computer storage media excludes signals per se.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 112 includes computer storage media in the form of volatile and/or nonvolatile memory. The memory may be removable, non-removable, or a combination thereof. Exemplary hardware devices include solid-state memory, hard drives, optical-disc drives, etc. Computing device 100 includes one or more processors that read data from various entities such as memory 112 or I/O components 120. Presentation component(s) 116 present data indications to a user or other device. Exemplary presentation components include a display device, speaker, printing component, vibrating component, etc.

I/O ports 118 allow computing device 100 to be logically coupled to other devices including I/O components 120, some of which may be built in. Illustrative components include a microphone, joystick, game pad, satellite dish, scanner, printer, wireless device, etc.

Figure 2:
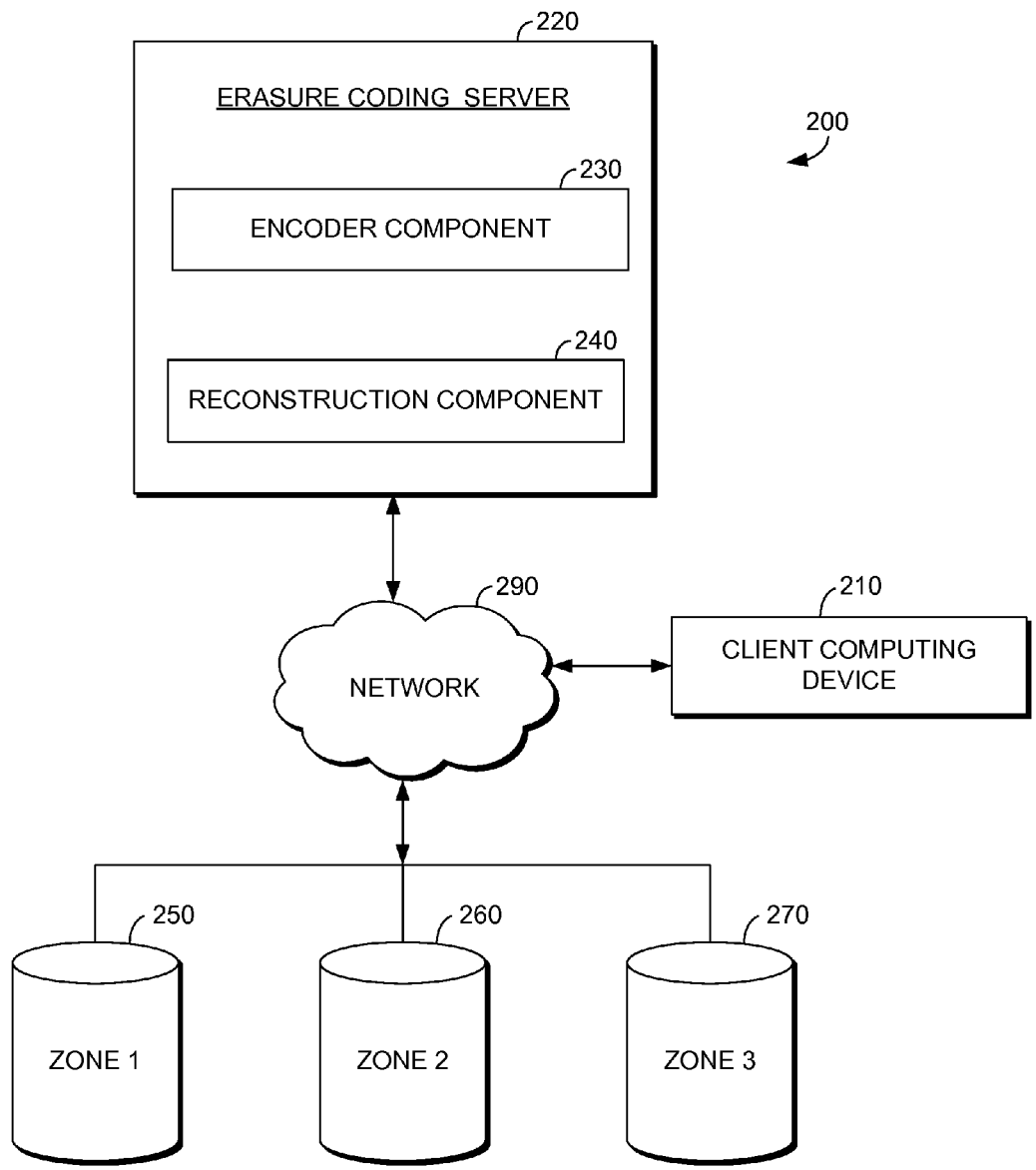
FIG. 2 is a block diagram of an exemplary distributed storage system in which embodiments of the invention may be employed.

With additional reference to FIG. 2, a block diagram depicting an exemplary distributed storage system 200 suitable for use in embodiments of the invention is described. Generally, the distributed system illustrates an environment in which data is encoded across multiple storage zones using a plurality of coding erasure coding schemes. Embodiments of the present invention also provide a system and method for selecting erasure coding schemes for erasure coding data chunks, based at least in part on implementation constraints associated with each erasure coding scheme. Among other components not shown, the distributed storage system 200 generally includes a client computing device 210, an erasure coding server 220 having an encoder component 230 and a reconstruction component 240, a plurality of zones—zone-1 250, zone-2 260 and zone-3 270 all in communication with one another via a network 290.

In some embodiments, one or more of the illustrated components/modules may be implemented as stand-alone applications. Any number of client computing devices, zones, and erasure coding servers, may be employed in the computing system 200 within the scope of embodiments of the present invention. Each may comprise a single device/interface or multiple devices/interfaces cooperating in a distributed environment. For instance, the erasure coding server 230 may comprise multiple devices and/or modules arranged in a distributed environment that collectively provide the functionality of the erasure coding server described herein.

Additionally, other components/modules not shown also may be included within the distributed storage system 200. For example, a cloud computing environment that is configured to allocate virtual machines within a data center for use by a service application. For instance, the cloud computing platform may be a public cloud, a private cloud, or a dedicated cloud. The cloud computing platform may include a data center configured to host and support operation of endpoints a particular service application. The phrase "service application," as used herein, broadly refers to any software, or portions of software, that runs on top of, or accesses storage locations within, the data center. In one embodiment, one or more of the endpoints may represent the portions of software, component programs, or instances of roles that participate in the service application.

It should be understood that this and other arrangements described herein are set forth only as examples. Other arrangements and elements (e.g., machines, interfaces, functions, orders, and groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

With continued reference to FIG. 2 the client computing device 210 may include any type of computing device, such as the computing device 100 described with reference to FIG. 1, for example. A plurality of client computing devices 210 may be associated with the distributed storage system 200. The client computing device 210 may be used to retrieve data stored any of the one or more zones described herein.

Zones may refer to particular buildings, data centers, and geographic regions providing a storage service. For example, a data center may be implemented as a cloud computing environment that is configured to allocate virtual machines within the data center for use by a service application. Erasure coding across multiple zones encompasses providing erasure coding at any level of fault tolerance defined by the storage service in the zone. It will be understood and appreciated by those of ordinary skill in the art that the information stored in association with the zone may be configurable and may include any information relevant to, among other things, erasure coding data including data chunks, local parities, and zone parities. The content and volume of such information are not intended to limit the scope of embodiments of the present invention in any way.

Further, though illustrated as a single, independent component, the zones may, in fact, be a plurality of components including storage devices, for instance a collection of racks and servers and, another external computing device (not shown), and/or any combination thereof. As such, providing zone fault-tolerance allows zones to have the capacity to continue to operate in the event of the accidental or deliberate loss of service in components of the zone that impact access or cause data loss. Accidental loss of service may include failures in storage, transmission or process components e.g., power failure, hardware failure, internet service provider (ISP) failure or data corruption. Regional zone failures may be associated with natural disasters, earthquakes, flood, tornadoes, etc. that cause data loss. Deliberate loss of service may include planned network outages (e.g., maintenance outages) during which the data in a zone is unavailable.

As zones are large-scale storage systems, the correlated failure due to large-scale outages is supported by embodiments in the present embodiments. The implementation erasure coding across zones, however, creates a different set of implementation constraints. For example, with continued reference to FIG. 2, the network 290 may include, without limitation, one or more local area networks (LANs) and/or wide area networks (WANs). Such networking environments are commonplace in offices, enterprise-wide computer networks, intranets and the Internet. With embodiments of the present invention, the cost dimension for the erasure scheme is associated with the distributed storage system zones (e.g., zone-1 250, zone-2 260 and zone-3 270). The distributed storage system 200 may include several sub-storage systems each within a single zone. Each of the sub-systems may be linked together by the network 290 backbone spanning across the zones. As such, total cost may be determined based on a single-zone sub-storage system and cross-zone network backbone. The single-zone sub-storage system may be a function of the storage overhead—the total amount of physical storage space required to store a specified amount of user data. The cross-zone network backbone may be a function of the amount of network bandwidth to be provisioned to support the storage system.

The performance metric may refer to the ability to recover from different types of failure scenarios. Different types of zone failures have different impacts on system performance. As such, when a storage node or a fault domain within a zone fails, the system runs in a degraded mode. However, when an entire zone fails, the system runs in a disaster mode. In order to characterize performance, for example, in a degraded mode, a degraded read cost (i.e., the number of disk I/Os required to read one unit of user data from failed storage node) may be defined. Similarly a disaster read cost may be defined as the number of disk I/Os required to read one unit of user data that was in a failed zone. Disk I/Os are contemplated to include network transfer costs for communicating data. The reliability metric may also be a function of the network 290 in that the reliability is based upon the ability to reconstruct data after one or more machines fails or becomes unavailable. For example, reliability may be evaluated based on a Mean Time to Data Loss (MTTDL).

The erasure coding server 220 of FIG. 2 is generally configured to receive and communicate information for erasure coding. Information may generally include, communications (e.g., requests for encoding or reconstructing data) and/or actual data chunks that are encoded with erasure coding scheme described herein. As illustrated, the erasure coding server 220 includes an encoder component 230 and a reconstruction component 240. The erasure coding server 220 has access to the different zones. For example, the erasure coding server 220 may receive and send data (e.g., data chunks) to the different zones. Data chunks may be data that need to be encoded or may be data that have been recovered. It is contemplated that the data may also be received from an external storage component (not shown) that is not in one of the zones shown.

An embodiment of the present invention may include a plurality of erasure coding servers 220 each associated with several zones, where data at the zones is processed according to embodiments of the present invention. Further, the erasure coding server 220 may be associated with an interface with interface elements that facilitate functions executed by the erasure coding server. For example, interface element may provide for selection of particular erasure coding scheme for particular chunks of data. Interface elements may provide information on particular dimensions and implementation constraints associated with the erasure coding schemes such that a scheme may be selected based on particular considerations associated with an entity (e.g., tenant having a service application) storing the data. Any and all such variations, and any combination of interface elements to realize embodiments of the present invention are contemplated to be within the scope.

The encoder component 230 of the erasure coding server 230 is configured to receive requests to encode data. A data chunk may be received along with a selected erasure coding scheme for encoding the data chunk. The encoder component may also determine and/or select the type of erasure coding that is implemented for the data chunk. Determining an erasure coding scheme is based at least in part on dimensions (e.g., cost, performance, and reliability) associated with the encoding scheme. Selecting an erasure encoding scheme may be facilitated by interface elements of the erasure coding server.

In particular, the goals of an entity (e.g., a tenant associated with a cloud computing platform) storing a data chunk may be aligned with a coding scheme that achieves the goals. For example, an entity may value a first encoding scheme over a second encoding scheme in that the scheme affords better performance. Further, the encoder component 230 is configured to execute encoding steps associated with the different coding schemes. As discussed in more detail below, the steps for encoding data chunks are performed by the encoder component 230. For example, the encoder components divide data into chunks, computes different parities, identifies the location for the data chunks and parities, and communicates the data chunks as directed by each erasure coding scheme.

The reconstruction component 250 of the erasure coding server 230 is configured to receive requests to reconstruct or recover data. As discussed, data loss may be either accidental or deliberate data loss. A portion of an encoded data chunk to be recovered may be identified by the reconstruction component 250 along with an associated erasure coding scheme for recovering the portion of the encoded data chunk. It is contemplated that information of data loss and/or details of data to be recovered may be communicated from an external source (not shown) to the reconstruction component that then recovers the portion of the encoded data. Similar to the encoding data chunks, the reconstruction process may also be facilitated by interface elements of the erasure coding server 220. The encoder component 230 is configured to recover portions of the encoded data chunk according to the coding schemes. In particular, an erasure coding scheme and local or zone parities associated with the portion of the data chunk to be recovered. As discussed in more detail below, the steps and components for reconstruction portions of the data chunk vary based on the erasure coding scheme.

Figure 3:
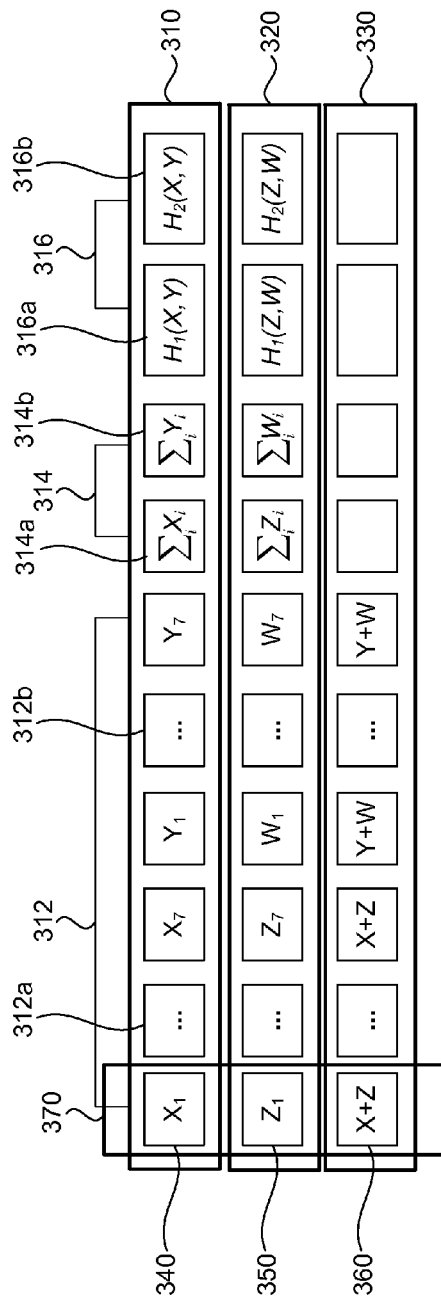
FIG. 3 is a schematic diagram showing an exemplary erasure coding scheme in accordance with embodiments of the present invention.

With reference to FIG. 3, a schematic diagram is illustrated showing an exemplary XLRC erasure coding scheme. The XLRC erasure coding scheme encodes data for three zones—zone-1 310, zone-2 320, and zone-3 330. Each zone may be a data center, a building, or a region. A data chunk is divided into sub-fragments evenly between two zones. For example, the zone-1 310 includes sub-fragment 312 having a first set of zone data-fragments 312a [X1-X7] and a second set of zone data-fragments 312b [Y1-Y7]. Similarly, zone-2 320 has the second sub-fragments having a first and second set of zone data-fragments [Z1-Z7] and [W1-W7]. Within each zone, the sub-fragments (e.g., 312) are protected by a number of local parities 314 and zone parities 316. The local parities 314a and 314b are each computed from the zone data-fragments (e.g., 312a and 312b respectively) in each zone. For example, the first local parity 314a is associated with the first set of zone data-fragments 312a and the second local parity 314b is associated with the second set of zone data-fragments 312b. An XOR in the horizontal direction is used to compute each local parity, for the associated zone-data fragments. The local parities 314 enable efficient failure reconstruction within the zone.

The zone parities 316a and 316b are generated from the all the sub-fragments from the zones and provide maximum fault-tolerance (i.e., maximally recoverable). The sub-fragments of the zones, the local parities, and the zone parities combined form an LRC. Each individual zone fragment (e.g., 340 and 350) from each of the two zones is used to compute a cross-zone parity (e.g. 360) by XORing the individual zone fragments (data an parity). The XOR 370 is computed in a vertical direction. Each computed cross-zone parity (e.g., cross-zone parity 360) is assigned to a third zone (parity zone), zone-3 330. Cross-zone parities are computed for all zone fragments, including data fragments, local parities 314 and zone parities 316. In this regard, the third zone contains three types of cross-zone parities, those for XORing the zone data-fragments, XORing the local parities, and XORing the zone parities.

The LRC and XOR are linear computations. Due to the commutative property of linear computations, the XOR 370 sum of parities 360 are parities of individual XOR sums 340 and 350. Thus, the three types of cross-zone parities assigned to the third zone also form an LRC within the zone-3 330. As such, all failures with the third zone may be reconstructed from zone fragments within the zone. In addition, following the property of LRC, single failure in the zone may be efficiently reconstructed.

With regard to reconstruction, XLRC provides recovery of data fragments for arbitrary (r+1) and up to (r+l) failures within a single zone without cross-zone recovery. As shown, a XLRC has k zone data-fragments, 1 sets of zone data-fragments, and r zone parities, where k=14, l=2 and r=2. In the example, with reference to FIG. 7, block 710 XLRC, the storage overhead is 1.93x. When up to 3 data fragments fail they can be reconstructed within the zone from 7 individual zone data-fragments in its local set of zone data-fragments or using the intra-zone parities (316a and 316b) in that zone, so the degraded read cost is 7 or 14. When an entire zone fails, a missing data fragment is reconstructed from 2 fragments across the surviving zones. As such, the cross-zone bandwidth for the XLRC erasure coding scheme is low.

Figure 4:
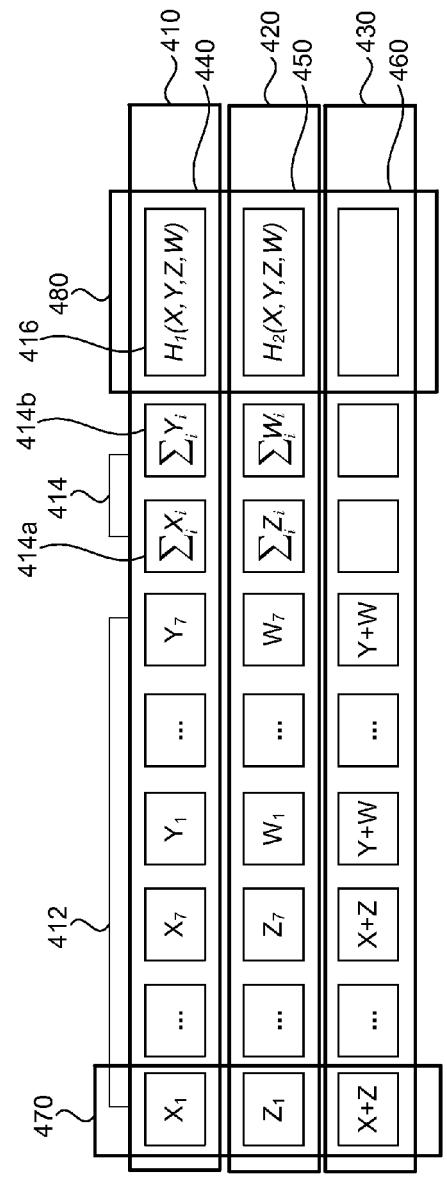
FIG. 4 is a schematic diagram showing an exemplary erasure coding scheme in accordance with embodiments of the present invention.

With continued reference to FIG. 4, a schematic diagram is illustrated showing an exemplary BLRC erasure coding scheme. The BLRC erasure coding scheme also encodes data for three zones—zone 1 410, zone-2 420, and zone-3 430. The Balance Local Reconstruction Code (BLRC) erasure code scheme supports a flexible balance between storage overhead and cross-zone network traffic. The BLRC scheme utilizes more cross-zone network provisions. The BRLC scheme also maintains lower storage overhead.

Structurally, the BLRC replaces XLRC zone parities (e.g., 316a and 316b) which protect zone data-fragments within a zone, with an inter-zone parity 416, which protects data fragments across all zones. In operation, a data chunk is divided into sub-fragments (e.g., 412) evenly among zones. Within each zone, the sub-fragments are protected by local parities 414. The local parities 414a and 414b are computed from the zone data-fragments in each zone to enable efficient failure construction. A number of inter-zone parities 450 and 460 are computed from all the sub-fragments of each zone. The inter-zone parities provide maximum fault-tolerance across zones. This is a distinguishing feature between the BLRC and the XLRC. Each individual zone fragment from each of the zone is used to compute a cross-zone parity by XORing the fragments. The XOR 480 is computed in a vertical direction. The cross-zone parities are generated for all zone fragments in each zone, including data fragments, local and global parities.

The third zone contains three types of cross-zone parities, from XORing zone data-fragments, XORing local parities, and XORing inter-zone parities. Similar to the XLRC, following the commutative property, it is possible to reconstruct failure in the third zone locally. In BLRC, single failure of zone data-fragments or local parity may be reconstructed using other fragments within the same zone. The BLRC inter-zone parities 440, 450 and 460 provide cross-zone redundancy even in the disaster mode when an entire zone fails. This may allow the BLRC to achieve higher storage efficiency than the XLRC while maintaining comparable durability.

With regard to reconstruction, BLRC provides recovery of 6 arbitrary fragments without zone failure and 3 failures after a zone failure. Two failures in a zone may require cross-zone recovery. As shown, BLRC has k zone data-fragments, 1 sets of zone data-fragments, and r zone parities, where k=14, l=2 and r=1. In the example, with reference to FIG. 7, block 720 BLRC I, the storage overhead is 1.82x. Single failure of data fragments is reconstructed within the zone from 7 fragments in the local set of zone data-fragments comprising 7 individual zone data-fragments, so the degraded cost is 7. When an entire zone fails, a missing data fragment is reconstructed from 2 fragments across surviving zones.

With continued reference to FIG. 5, a schematic diagram is illustrated showing an exemplary BLRC II erasure coding scheme. The BLRC II erasure coding scheme also encodes data for three zones—zone 1 510, zone-2 520, and zone-3 530. In operation, a data chunk is divided into sub-fragments (e.g., 512) evenly among zones. Different from BLRC I, BLRC II does not divide the data chunk into two local sets of zone data-fragments comprising 7 individual zone data-fragments but instead into it divides the data chunk into a single set of zone data-fragments 570 for each zone comprising 14 individual zone data-fragments. As mentioned, it is contemplated within the scope of this invention to have additional zones, so for a plus-one would also have a local set of zone data-fragments.

Within each zone, the sub-fragments are protected by a single local parity 514, which is different from BLRC I. The local parity 514 is computed from the 14 individual zone data-fragments in each zone to enable efficient failure construction. A number of inter-zone parities 540 and 450 are computed from all the sub-fragments of each zone. The inter-zone parities provide maximum fault-tolerance across zones. Each individual zone fragment from each of the zones is used to compute a cross-zone parity by XORing the fragments. The cross-zone parities are generated for all zone fragments in each zone, including data fragments, local and global parities. The third zone contains three types of cross-zone parities, from XORing zone data-fragments, XORing local parities and XORing inter-zone parities. Following the commutative property, it is possible to reconstruct failure in the third zone locally. The BLRC II inter-zone parities 540, 550 and 560 provide cross-zone redundancy even in the disaster mode when an entire zone fails.

With regard to reconstruction, BLRC II provides recovery of arbitrary 6 fragments without zone failure and 3 failures after a zone failure. Two failures in a zone require cross-zone recovery. As shown, BLRC II has k zone data-fragments, l sets of zone data-fragments, and r zone parities, where k=14, l=1 and r=1. In the example, with reference to FIG. 7, block 730 BLRC II, the storage overhead is 1.71x. Since the size of the local set of zone data-fragments 14, single failure of data fragments is reconstructed from 14 fragments in the zone, so the degraded read cost is 14. When an entire zone fails, a missing data fragment is reconstructed from 2 fragments across surviving zones.

With continued reference to FIG. 6, a schematic diagram is illustrated showing an exemplary FRC erasure coding scheme. The FRC erasure coding scheme also encodes data for three zones—zone 1 610, zone-2 620, and zone-3 630. Structurally, the FRC is derived from the BLRC by removing all local parities. Even though related to the BLRC, the FRC by removing local parities provides for a different type of fault-tolerance in that portions of the data chunk have to be reconstructed across zones.

In operation, a data chunk is divided into sub-fragments (e.g., 612) evenly among the zones. Within each zone, the sub-fragments are not protected by any local parities, a distinguishing feature of the FRC erasure coding scheme. A number of inter-zone parities 614 and 616 are computed from all the sub-fragments of each zone. The inter-zone parities provide maximum fault-tolerance across zones. Each zone has two zone parties. Each individual zone fragment from each of the zones is used to compute a cross-zone parity by XORing the fragments. The XOR 680 is computed in a vertical direction. In particular, corresponding zone fragments in zone-1 610 and zone-2 620 are XORed to compute parities in a corresponding position in a zone-3 630. The cross-zone parities are generated for all zone fragments in each zone, including data fragments, local and global parities.

As shown, FRC has k zone data-fragments and g inter-zone parities, where k=14, and g=2. In the example, with reference to FIG. 7, block 740 BLRC I, the storage overhead is 1.71x. The FRC scheme tolerates arbitrary 6 fragment failures without zone failure and tolerates 4 failures after a zone failure.

The reconstruction of data fragments due to either node failure or zone failure requires 2 fragments across zones.

Figure 8:
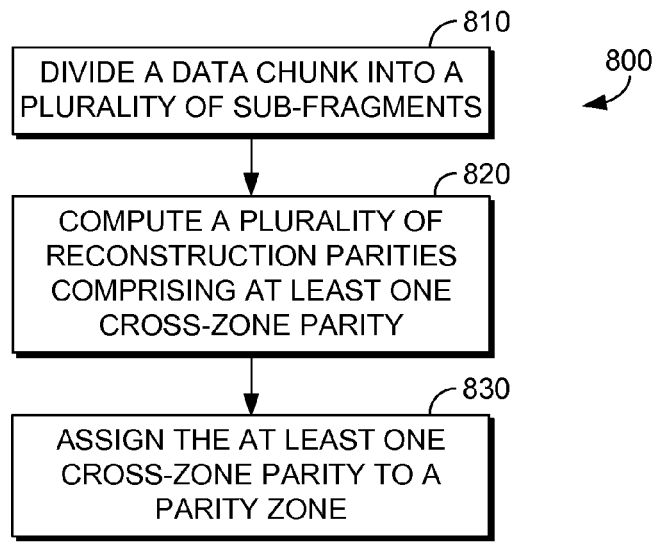
FIG. 8 is a flow diagram showing a method for erasure coding data across multiple zones, in accordance with embodiments of the present invention.

Turning now to FIG. 8, a flow diagram is provided that illustrates a method 800 for erasure encoding data across multiple storage zones. At block 810, a data chunk is divided into a plurality of sub-fragments. Each of the plurality of sub-fragments is associated with at one or a plurality of zones. At block 820, a plurality of reconstruction parities are computed. Each of the plurality of reconstruction parities is computed using at least one sub-fragment from the plurality of sub-fragments. The plurality of reconstruction parities comprises at least one cross-zone parity. At block 830, the at least one cross-zone parity is assigned to a parity zone. The cross-zone parity provides cross-zone reconstruction of a portion of the data chunk.

Figure 9:
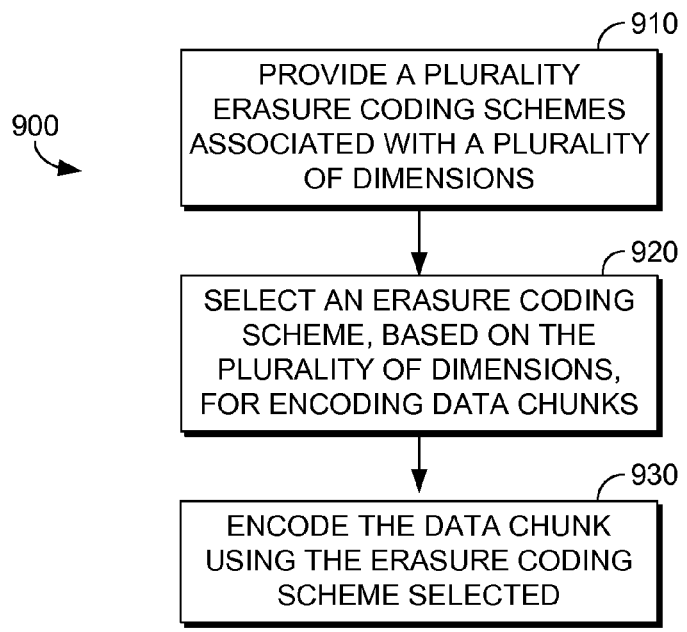
FIG. 9 is a flow diagram showing a method for erasure coding data across multiple zones, in accordance with embodiments of the present invention.

Turning now to FIG. 9, a flow diagram is provided that illustrates a method 900 for erasure encoding data across multiple storage zones. At block 910, a plurality of erasure coding schemes is provided. The plurality of erasure coding scheme is associated with a plurality of dimensions that define implementation constraints for the erasure coding schemes. At block 920, an erasure coding scheme is selected. The erasure coding scheme is selected based on the plurality of dimensions for encoding data chunks. At block 930, the data chunk is encoded using the erasure coding scheme selected. The erasure coding scheme divides the data chunk into a plurality of sub-fragments in one or more groups in a selected zone from the plurality of zones, each of the one or more groups comprising one or more zone data-fragments in the selected zone. Further, a selected erasure coding scheme encodes the data chunks based on steps of the erasure coding scheme as described hereinabove.

Figure 10A:
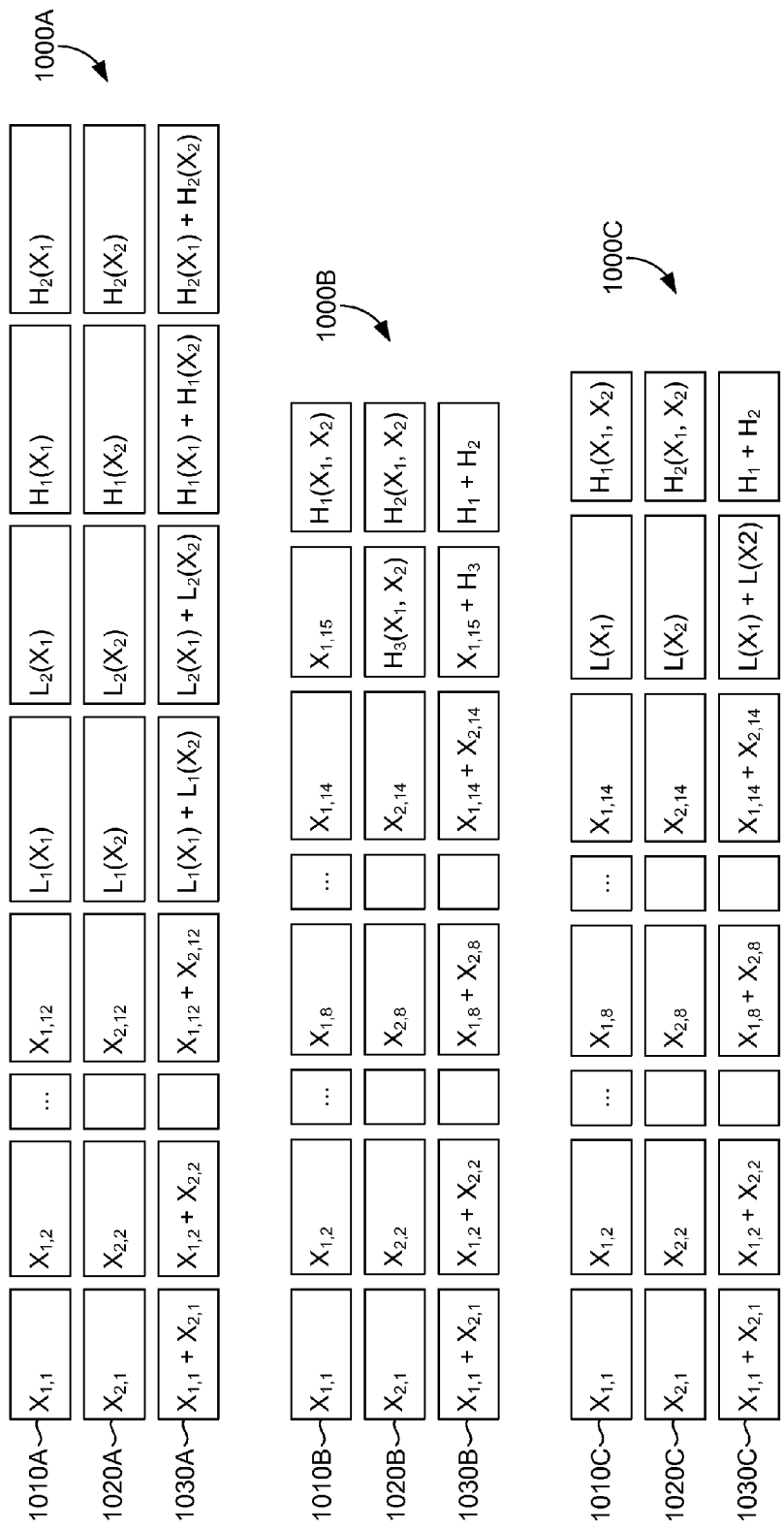
FIG. 10A is a schematic diagram showing an exemplary erasure coding scheme in accordance with embodiments of the present invention.

Turning to FIG. 10A, a schematic diagram is illustrated showing exemplary erasure coding schemes XLRC 1000A (XOR-LRC), BLRC, FRC 1000B (Frugal Reconstruction Code) 1000B and BLRC 1000C (Balanced Local Reconstruction Code), as discussed above. Each scheme may be configured with 3 zones (1010A, 1020B, 1030C, 1010A, 1020B, 1030C, and 1010A, 1020B, 1030C) with 16/20 racks per zone. As discussed above, XLRC is associated with low bandwidth with overhead of 1.87x-2x; FRC is associated with high bandwidth with overhead of 1.62x-1.66x and BLRC is associated with medium bandwidth with overheard of 1.67x-1.71x. As best shown in FIG. 10B a chart comparing implementation constraints of the erasure coding schemes is provided.

Figure 11A:
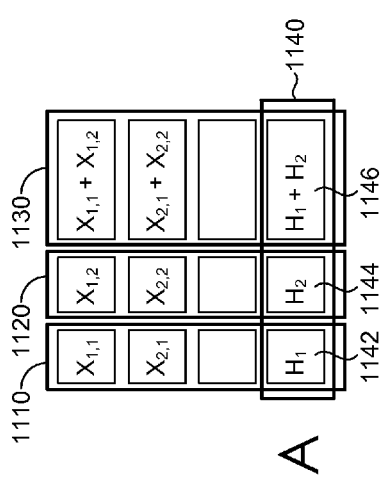
FIG. 11A is a schematic diagram showing an exemplary erasure coding scheme in accordance with embodiments of the present invention.

In FIG. 11A, a schematic diagram is illustrated showing another exemplary erasure coding for a particular zone according to embodiments of the present invention. The individual zone depiction may be an exemplary zone in an erasure coding operation. As shown in FIG. 11A, the zone may be setup with three sub-zones 1110, 1120, 1130. The erasure coding computes 2 reconstruction parities based on all zone data fragments and places the reconstruction parities in an intra-zone parity grouping 1140. In addition, the erasure coding computes 8 reconstruction parities including 1146 based on an XOR across sub-zone data or parity fragments. In this exemplary embodiment, each sub-zone is configured to support 8 racks, although more or less racks may be implemented. The zone configuration may be referred to as [14, 24] code because the zone includes 7 data fragments in sub-zone 1110, 7 data fragments in sub-zone 1120, and 10 reconstruction parities—8 including 1146 in sub-zone 1130, 1142 and 1144. The zone tolerates one subzone failure and two rack failures. Without sub-zone failure, the zone may tolerate four arbitrary rack failures.

Figure 11B:
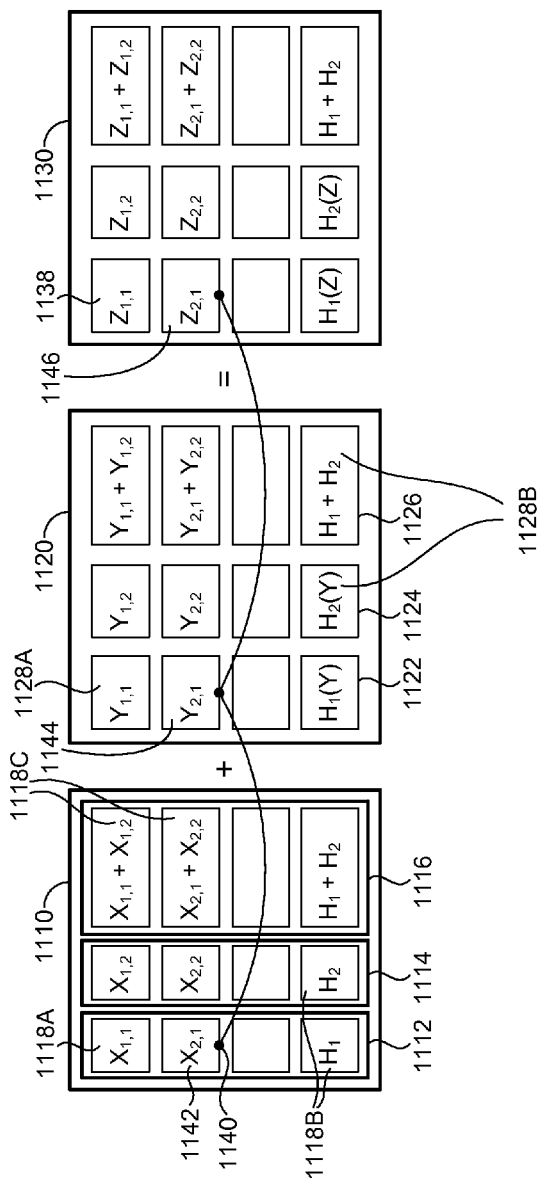
FIG. 11B is a schematic diagram showing an exemplary erasure coding scheme in accordance with embodiments of the present invention.

With reference to FIG. 11B, a schematic diagram is illustrated showing an exemplary Scheme A erasure coding implementation. Scheme A employs two separate erasure codes, FRC across multiple sub zones (SZ) of the same availability zone (AZ) as shown in FIG. 10 and an exclusive-or (XOR) across multiple AZs. By way of example, let X, Y, and Z denote three zones 1110, 1120, and 1130 as depicted in two-dimensional grids having fault domains (FD) and SZs associated with each AZ. In operation, data is divided into two or more data chunks, the two or more data chunks corresponding to two or more zones (e.g., 1110, 1120). Each zone having three of more SZs (e.g., 1112, 1114, 1116 of zone 1110 and 1122, 1124, 1126 of zone 1120). For a selected zone, 1110 or 1120, a data chunk corresponding to the selected zone may be divided into a plurality of sub-fragments (e.g., 1118A and 1128A). Each of the plurality sub-fragments is associated with one of a plurality sub-zones. A plurality of reconstruction parities (e.g., 1118B, 1118C and 1128B, 1128C) may be computed based on applying Frugal Reconstruction Coding (FRC) to the plurality of sub-fragments. The reconstruction parities—local parities 1118C, 1128C and zone parities 1118B, 1128B may be placed in the appropriate subzones based on the FRC erasure coding. A plurality of cross-zone parities (e.g., 1138) based an exclusive-or between the plurality of sub-fragments and the plurality of reconstruction parities in the zones 1110 and 1120 may be computed. The plurality of sub-fragments and the plurality of reconstruction parities correspond across the two or more zones. For example, an XOR 1140 utilizes a first data fragment 1142 and a second data fragment 1144 to compute a cross-zone parity 1146. The plurality of cross-zone parities may be assigned to a parity zone (e.g., zone 1130). For example, cross-zone parity 1146 may be assigned to zone 1130.

Scheme A may be implemented with different number of zone configurations. For example, in a 3 zone configuration, may have [28, 72] code—2.57x overhead and a 4 zone configuration may have a [42, 96] code—2.28x overhead. Scheme A further provides high reliability in that the scheme tolerates one zone failure and one subzone failure plus 2 rack failures per zone. Scheme A also has a low inter-zone bandwidth in that the scheme provides in-zone recovery for one subzone and 2 rack failures.

Figure 12:
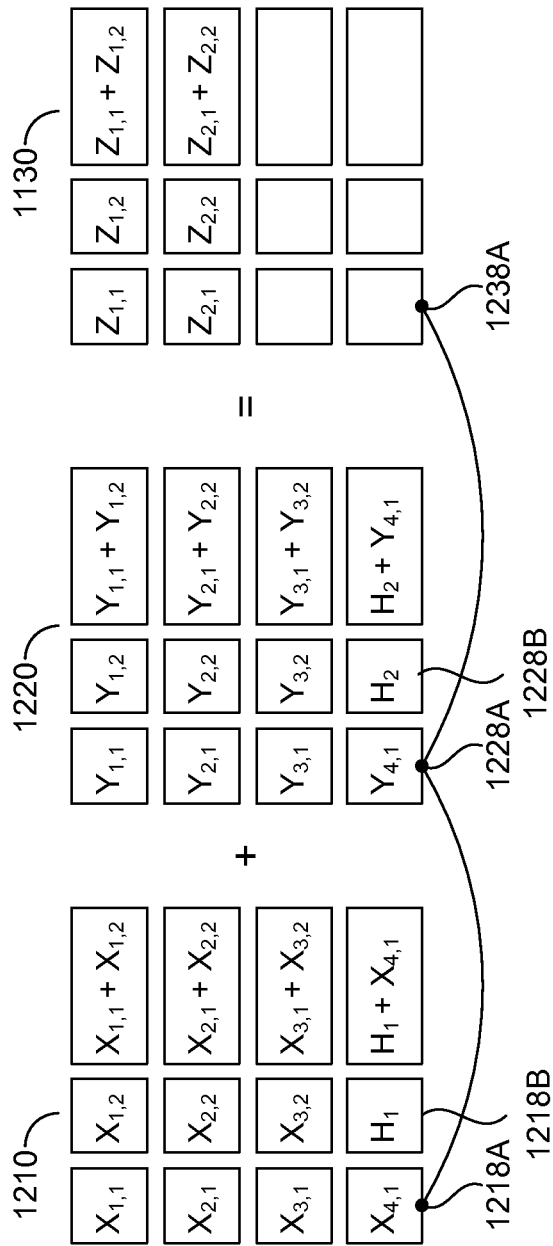
FIG. 12 is a schematic diagram showing an exemplary erasure coding scheme in accordance with embodiments of the present invention.

FIG. 12 illustrates an alternative implementation of Scheme A. In this implementation, the number of zone parities in each AZ may be reduced. For example, the zone parities may be substituted with additional sub-fragments of data (e.g., 1218A and 122A) in zones 1210 and 1220. As such in contrast to FIG. 11 having two zone parities i.e. (two 1118B and two 1128B in zones 1110 and 1120, respectively, each may contain just one zone parity (e.g., 1218B and 1228B). The data fragments may be used in an XOR 1140 that utilizes a first data fragment 1218A and a second data fragment 1228B to compute a cross-zone parity 1238. Further, 1218B and 1228B, local to the zone, tolerate a subzone and 1 rack failure or 2 rack failures locally. 1218B and 1228B tolerate subzone failures locally but may require more bandwidth. This alternate Scheme A may be implemented with different number of zone configurations. For example, in a 3 zone configuration with 4 racks—2.57x overhead and a 4 zone configuration with 4 racks—2.28x overhead. In yet another variation of Scheme A, the zone parities in 1110 and 1120 may be replaced with global parities that can be generated from all the data fragments in 1110 and 1120. The alternate variations of Scheme A may achieve slightly different trade-offs among storage overhead, reconstruction cost and durability.

Figure 13A:
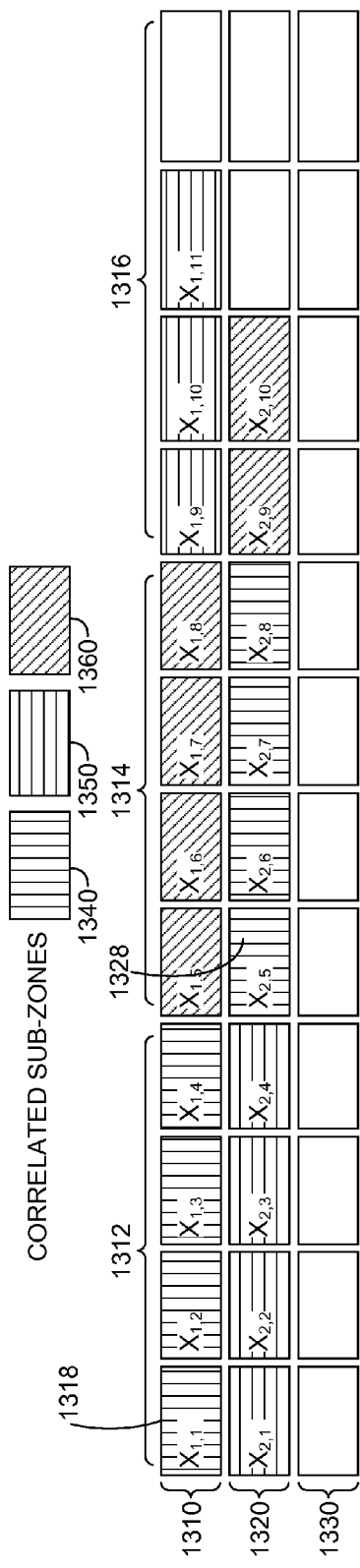
FIG. 13A is a schematic diagram showing an exemplary erasure coding scheme in accordance with embodiments of the present invention.
Figure 13B:
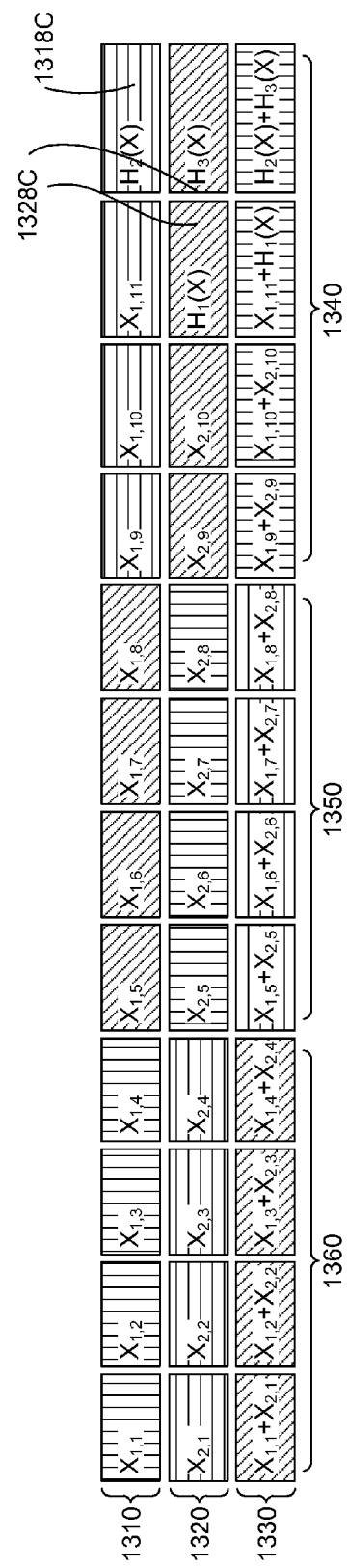
FIG. 13B is a schematic diagram showing an exemplary erasure coding scheme in accordance with embodiments of the present invention.
Figure 13C:
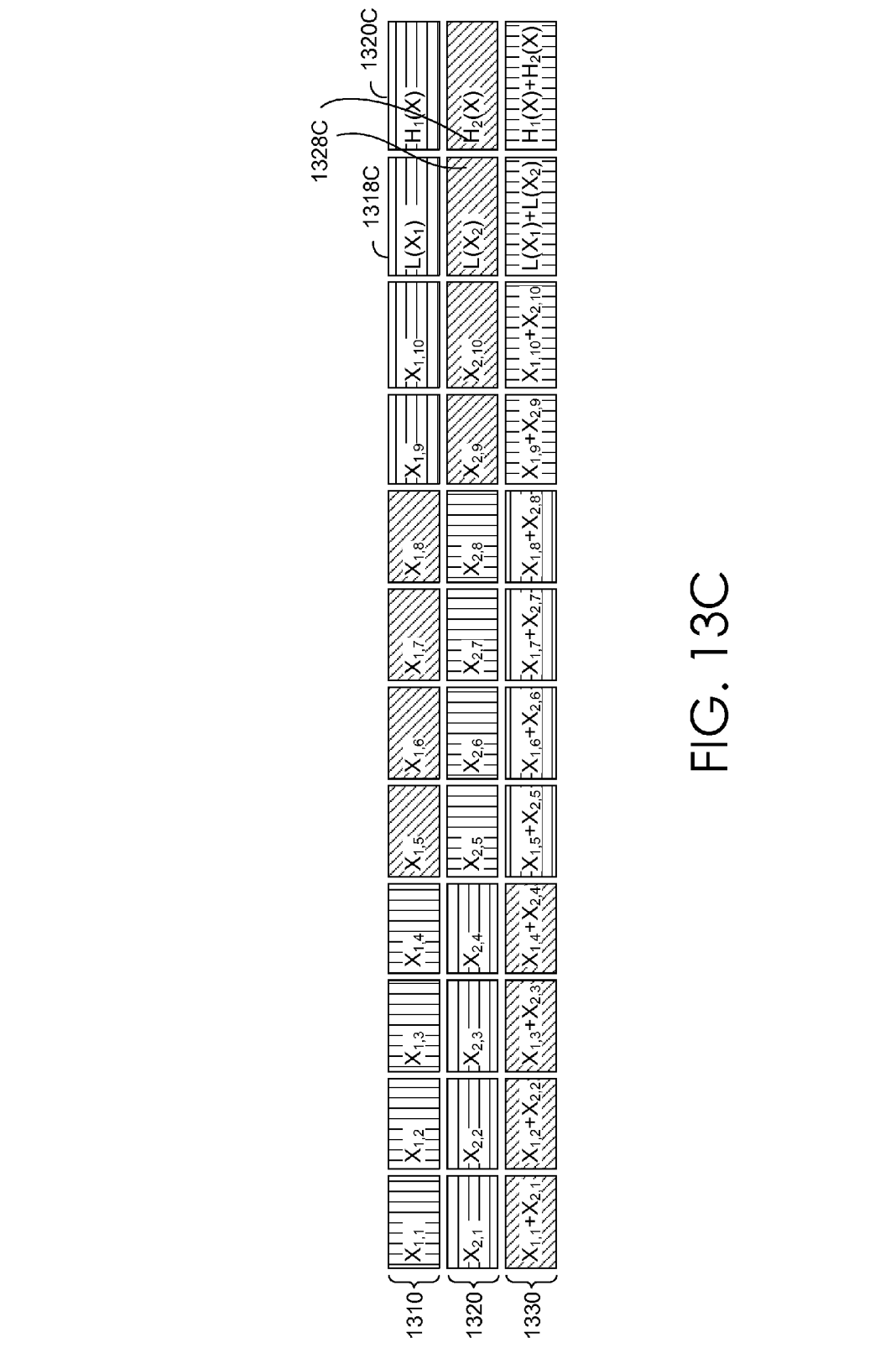
FIG. 13C is a schematic diagram showing an exemplary erasure coding scheme in accordance with embodiments of the present invention.

Turning to FIGS. 13A-C, the FIG. 13A schematic diagram is illustrated showing an exemplary Scheme B erasure coding implementation. Scheme B employs FRC across multiple SZs of the same AZ, arranged to produce a specific result, as shown. By way of example, let X, Y, and Z denote three zones 1310, 1320, and 1330 as depicted in two-dimensional grids having 4 FDs and 3 SZs associated with each of 3 AZ. Scheme B implements the code of the FRC model; however, each column of data is spread across power supplies. In operation, data is divided into two or more data chunks, the two or more data chunks corresponding to two or more zones (e.g., 1310, 1320) as shown in FIG. 13A. For a selected zone, 1310 or 1320, a data chunk corresponding to the selected zone may be divided into a plurality of sub-fragments (e.g., 1318, 1328*a*. In particular, the data fragments within each zone be grouped into zones (e.g., 1312, 1314, 1316) that are not correlated (non-correlated zones). However, the data fragment in each zone may be correlated across zones based on defined correlation criteria. In this regard, one or more subsets of the plurality of sub-fragments are assigned correlated sub-zones (e.g., 1340, 1350, and 1360) as a tolerance grouping, as shown.

In FIG. 13B, upon implementing the scheme B erasure coding, at least one inter-zone reconstruction parity 1318C may be computed using the plurality of sub-fragments in zone 1310 and 1320. 1318*c* becomes part of correlated zone 1350. Zone 1320 has two inter-zone reconstruction parities 1328C each becoming part of correlated zone 1360. Further, a plurality of cross-zone parities in groupings 1350, 1360 and 1340 may be computed using the plurality of sub-fragments and the at least one inter-zone reconstruction parity of each of the zones. The plurality of sub-fragments and the at least one inter-zone reconstruction parity correspond across the zones. The plurality of cross-zone parities may be assigned to a parity zone (e.g., 1330), the plurality of cross-zone parities provide at least cross-zone reconstruction of a portion of the data. The configuration in FIG. 13B may include 4 racks per subzone with a [21, 36] code—1.71x stretch and 1.63 stretch for 8 racks per subzone. Scheme B may tolerate a zone failure and three rack failures. Scheme B further tolerates correlated sub-zone failures and three rack failures.

FIG. 13C illustrates an alternative implementation of Scheme B. Scheme B implements the code of the BLRC model; however, each column of data is spread across power supplies. In this implementation, zone 1310 and 1320 each has one intra-zone and one intra-zone reconstruction parity (e.g., two 1318C and 1320C). In this regard, at least one data sub-fragment is replaced for an intra-zone parity. This alternate scheme tolerates single zone or single subzone and rack failures. As such, the scheme provides a slightly higher space overhead—for example, 4 racks per subzone—1.8x overhead. However the scheme necessitates less cross-zone bandwidth. A first failure of a data fragment may be recovered within the zone. May further tolerate three failures after a zone failure or a power supply failure.

Turning to FIGS. 14A and 14B, a schematic diagram is illustrated showing an exemplary Scheme C erasure coding implementation. Scheme C employs two separate erasure codes, BLRC and an XOR across multiple SZs of the same AZ, arranged to produce a specific result, as shown. By way of example, zones 1410, 1420, and 1430 as depicted in two-dimensional grids having FDs and SZs associated with each AZ. In operation, data is divided into two or more data chunks, the two or more data chunks corresponding to two or more zones (e.g., 1410, 1420). For a selected zone, 1410 or 1420 a data chunk corresponding to the selected zone may be divided into a plurality of sub-fragments (e.g., 1418A and 1428A). In particular, one or more subsets of the plurality of sub-fragments are assigned a correlated zone as a tolerance grouping, in this case subzones (e.g., 1440, 1450, and 1460) as shown.

A plurality of reconstruction parities (e.g., 1418B, 1428B) may be computed based on applying Balance Local Reconstruction Coding (BLRC) to the plurality of sub-fragments. The reconstruction parities—1418B and 1428B—may be placed in appropriate subzones based on the BLRC erasure coding. In particular, intra-sub-zone reconstruction parity 1418B for zone 1410 may be computed using the plurality of sub-fragments in zone 1410. 1418B also becomes part of the correlated sub-zone 1440 as a tolerance grouping. Zone 1410 may further have intra-sub-zone reconstruction parities in correlated sub-zones 1450 and 1460. Zone 1420 may also have additional intra-sub-zone reconstruction parities (e.g., 1428*b*).

In addition, a plurality of cross-zone parities (e.g., 1438C) based an exclusive-or between the plurality of sub-fragments and the plurality of reconstruction parities in the two or more zones may be computed. The plurality of cross-zone parities in groupings 1440, 1450 and 1460 may be computed using the plurality of sub-fragments in each correlated zone (e.g., 1440, 1450, 1460) and the at least one intra-sub-zone reconstruction parity each of the correlated zone. As shown in FIG. 14B, the BLRC inter-zone parities are placed in SZ 1460 in Y and generated as follows: $y\_\{3, j\}=H\_j(x\_\{i, j\}, i=1, 2, 3; y\_\{i, j\}, i=1, 2)$. For instance, $y\_\{3, 1\}=H\_1(x\_\{1, 1\}, x\_\{2, 1\}, x\_\{3, 1\}, y\_\{1, 1\}, y\_\{2, 1\})$. All fragments in Z are parities and generated using cross-AZ XOR as following: $z\_\{i, j\}=x\_\{i, j\}+y\_\{i, j\}$. The configuration in FIG. 14B may include [3, 4] parity check, with 2.4x overhead code for 3 zones, and 2x overhead code for 4 zones.

Scheme C may tolerate one zone failure, one sub-zone failure, and 1 rack per subzone. Sub-zone failures necessitate inter-zone reads. A single failure per subzone may be corrected within the zone. Scheme C also tolerates simultaneous failure of one AZ, on SZ and one FD. It is contemplated that Scheme C may be implemented with FRC across zones 1410 and 1420 where the FRC global parities are replaced in subzone 3 and generated the plurality of sub-fragments from both X and Y. In this alternate embodiment, the storage overhead may remain the same, while providing higher durability at the cost of higher reconstruction cost beyond a single FD failure.

Figure 15A:
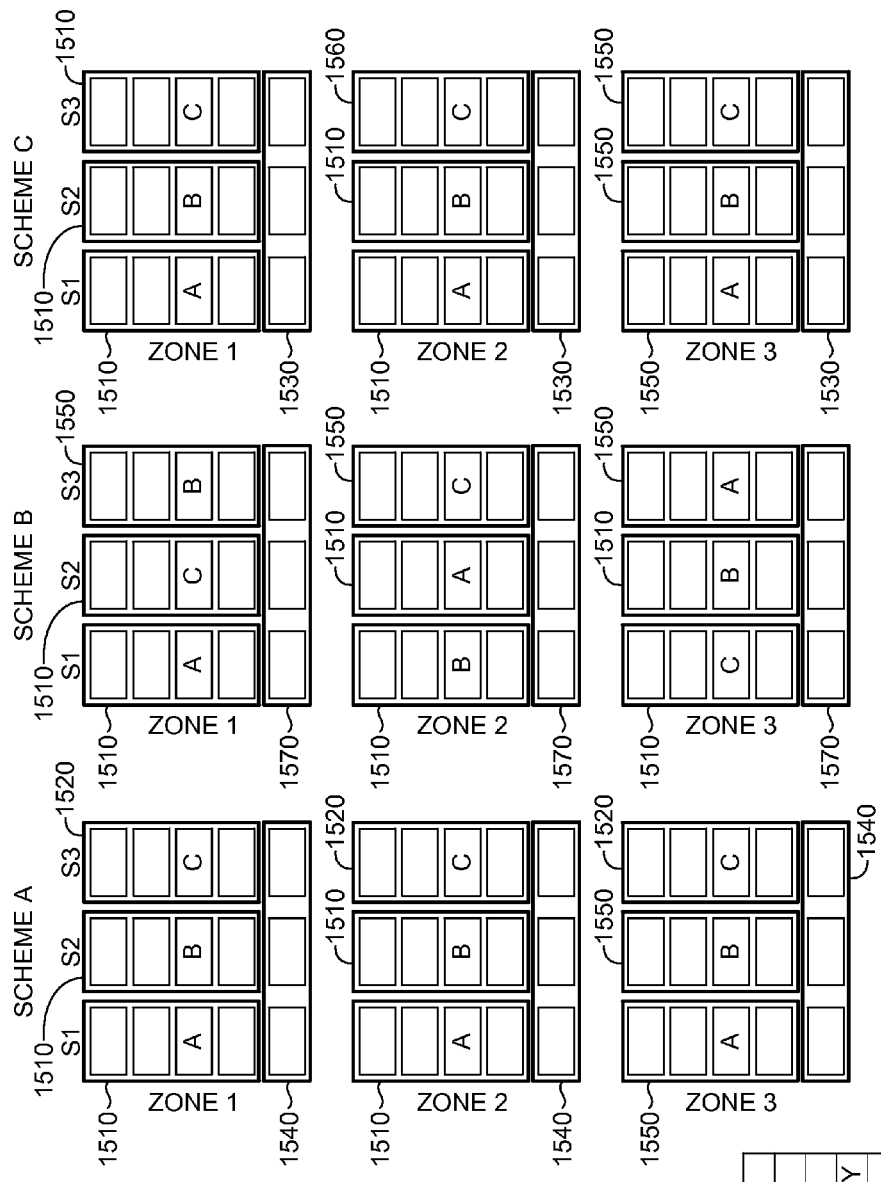
FIG. 15A is a schematic diagram showing an exemplary erasure coding scheme in accordance with embodiments of the present invention.

With reference to FIG. 15A, FIG. 15 is a schematic diagram illustrating an exemplary Scheme A, Scheme B, and Scheme C implementations according to embodiments of the present invention. Each scheme is depicted with three AZs, Zone 1, Zone 2, and Zone 3, each zone depicted in two-dimensional grids having 4 FDs and 3 SZs associated within each of the 3 AZ. Each subzone may further include data in a plurality of data chunks arranged in the subzone in a plurality sub-fragments, and a plurality of reconstruction parties generated based on an erasure coding scheme implemented on the plurality of sub-fragments. For example, each of schemes A, B, and C may include groupings of data fragments 1510, local row parities 1520, intra-subzone parities 1530, intra-zone parties 1540, inter-zone parties 1550, global parities 1560, and XOR group parities 1560. In embodiments, correlated zones as in tolerance groupings include A, B, and C positioned differently (e.g., spread across different power supplies) between zones to produce specific results, as discussed above. For example, in scheme B, Zone 1 has A, C, and B in sub-zones S1, S2, and S3 respectively, however. Zone 2 has B, A, C, and Zone 3 has C, B, A, in subzones S1, S2, and S3. Each of the erasure schemes may further be associated with specific constraints, e.g., storage overhead and bandwidth, as presented above. FIG. 10B is a chart comparing implementation constraints of the erasure coding schemes provided.

Figure 16A:
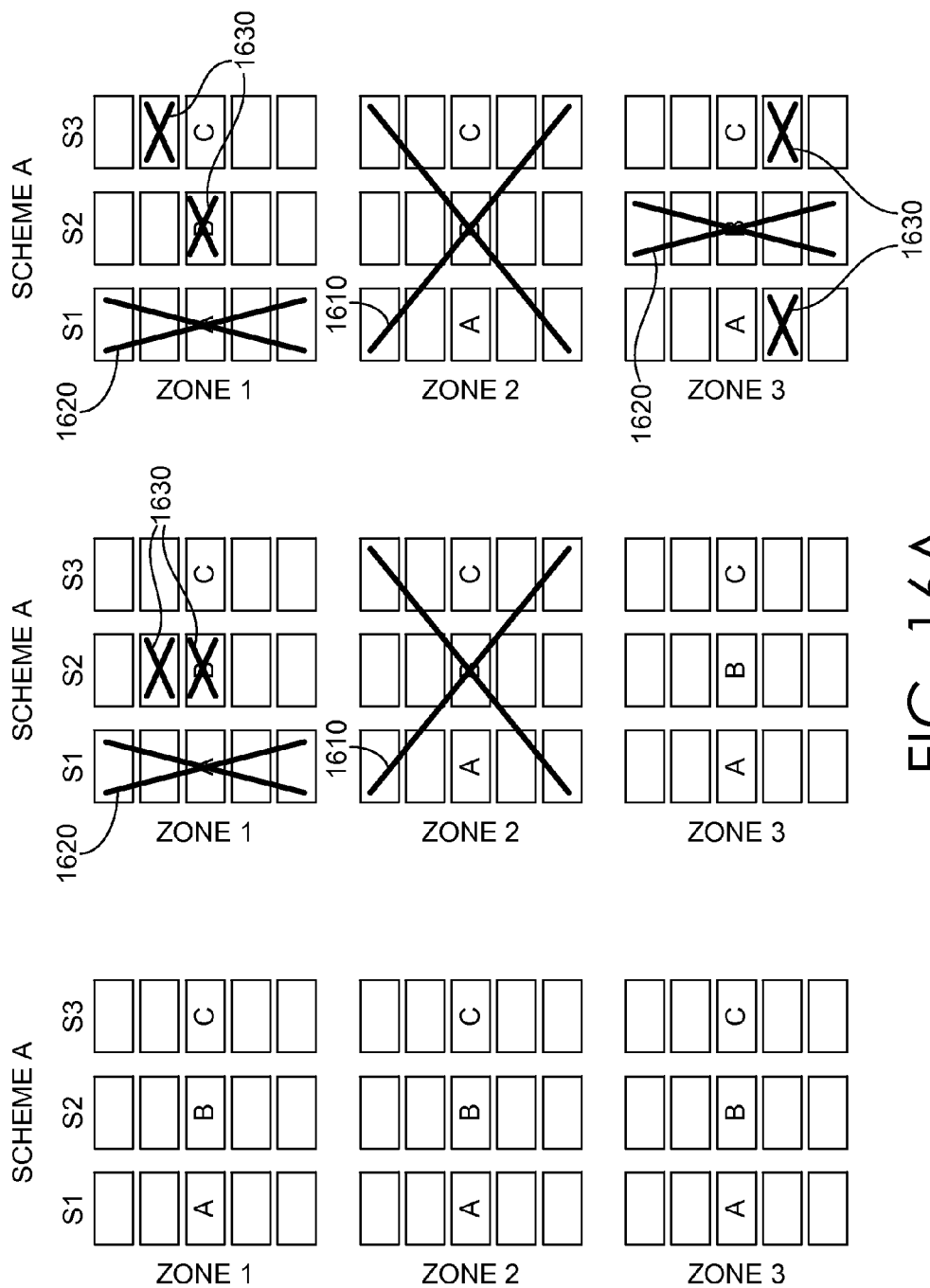
FIGS. 16A-16C are schematic diagrams showing exemplary erasure coding schemes in accordance with embodiments of the present invention.
Figure 16B:
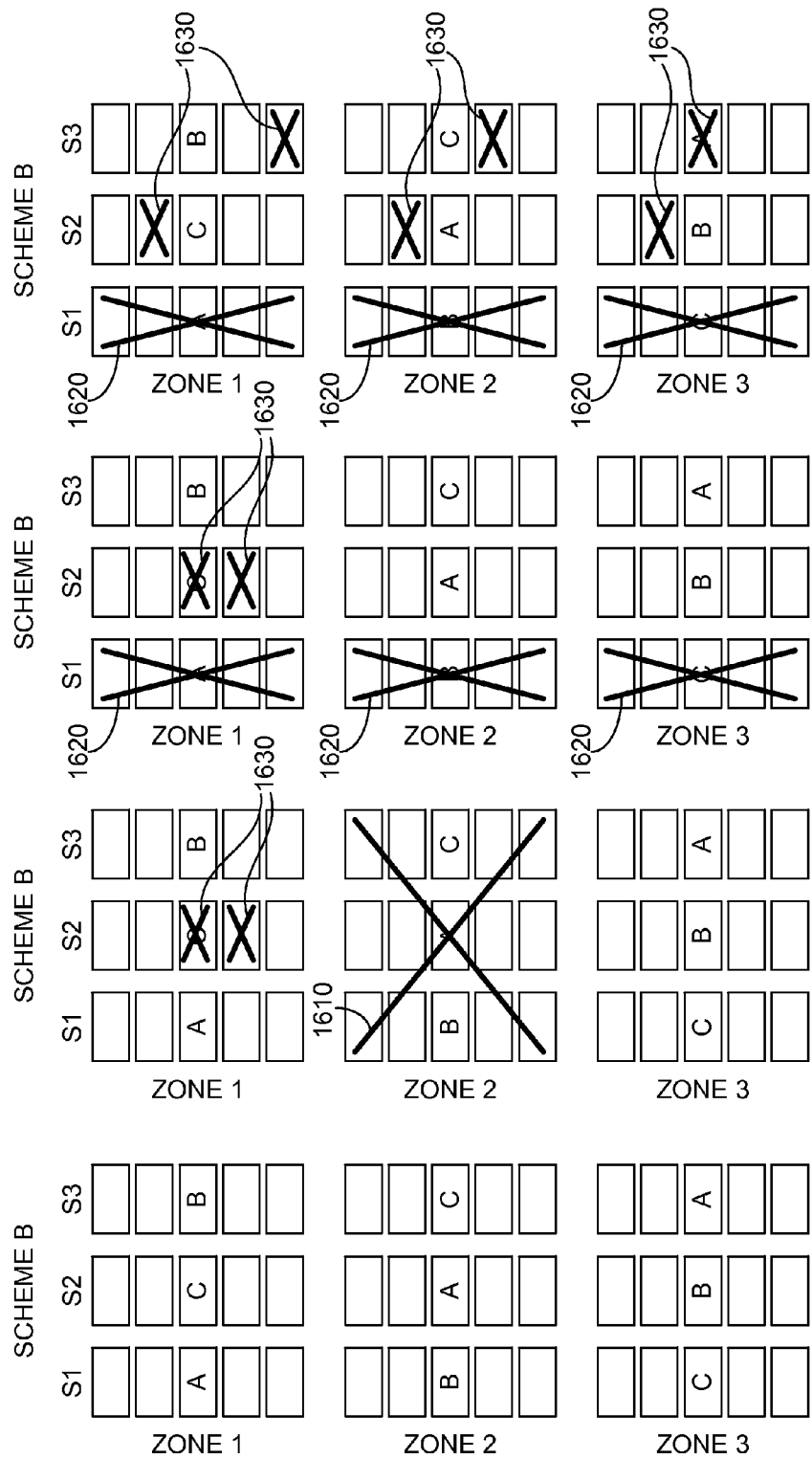
Figure 16C:
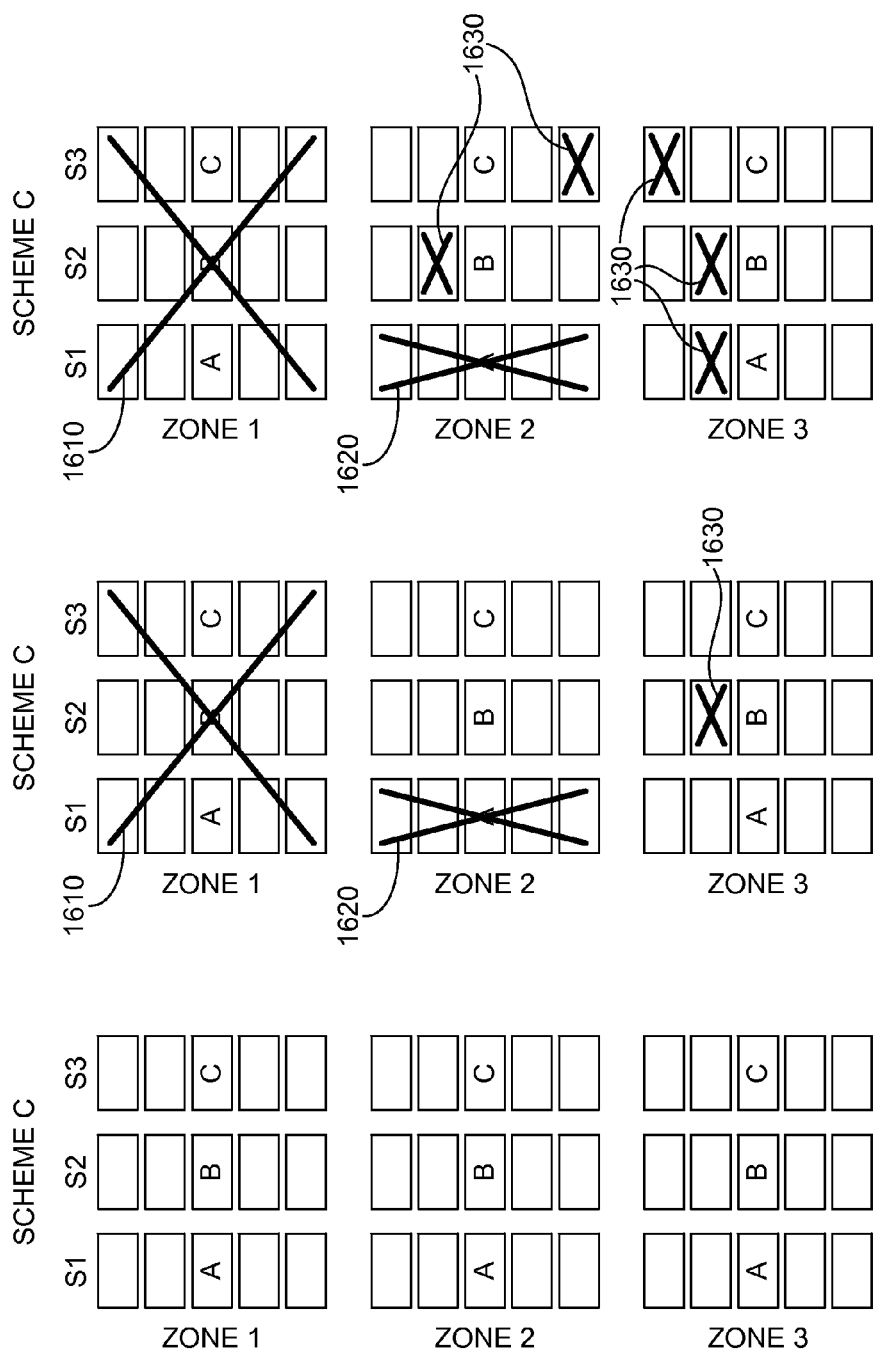

FIGS. 16A, 16B, and 16C illustrate tolerance metrics for each type of erasure coding scheme. For example, Scheme A provides high reliability in that the scheme tolerates one zone failure 1610*a* and one subzone failure 1620*a* plus 2 rack failures 1630*a* per zone. Scheme A also has a low inter-zone bandwidth in that the scheme provides in-zone recovery for one subzone and 2 rack failures. Scheme B tolerates a zone failure 1610B and up to 2 rack failures 1630B. Scheme B, with the special arrangement property, further tolerates correlated simultaneous failure of 3 SZs 1620B. The three sub-zones may fail simultaneously if they share the same tolerance grouping. Even after simultaneous failure of 3 SZs, scheme B may additionally tolerate 2 or more FD failures 16430B. Finally, Scheme C tolerates simultaneous failure of one AZ 1610*c*, one SZ 1620*c* and one FD 1630*c*. Scheme C may tolerate up to 3FD failures within a zone.

Figure 17:
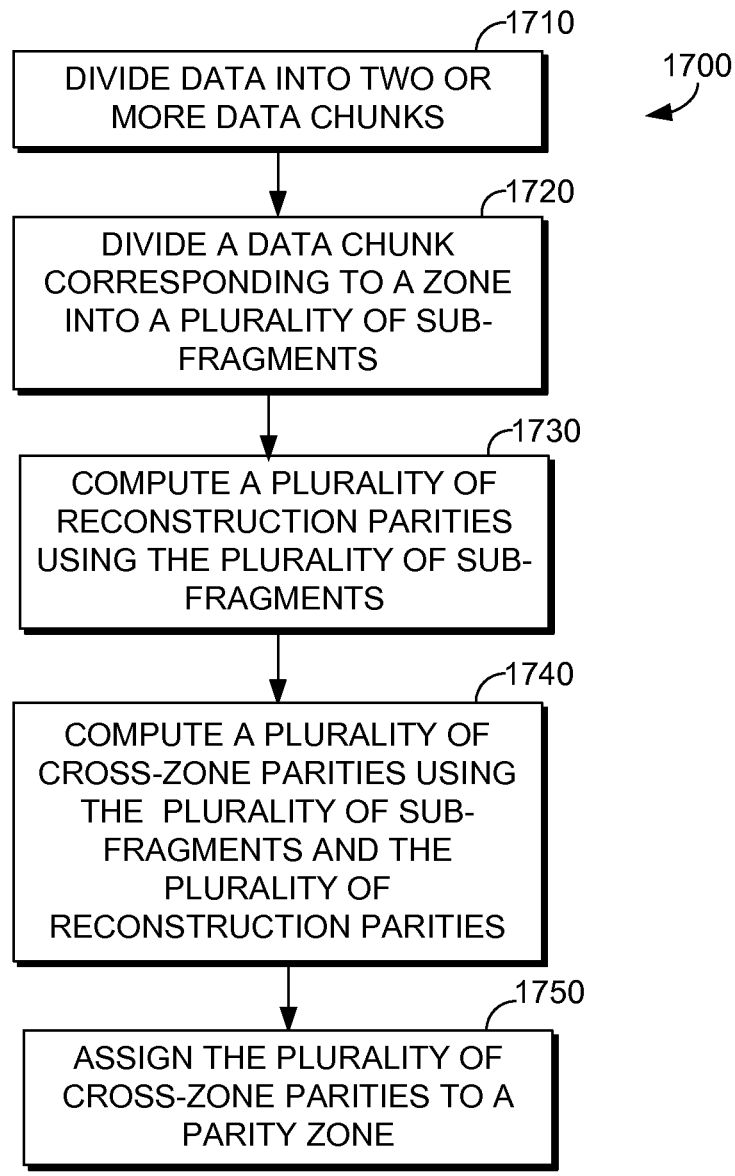
FIG. 17 is a flow diagram showing a method for erasure coding data across multiple zones, in accordance with embodiments of the present invention.

Turning now to FIG. 17, a flow diagram is provided that illustrates a method 1700 for erasure encoding data across multiple storage zones. At block 1710, data is divided into two or more data chunks. The two or more data chunks correspond to two or more zones. At block 1720, for the two or more zones, the data chunk corresponding to the zone is divided into a plurality of sub-fragments. Each of the plurality of sub-fragments is associated with one of a plurality sub-zones. Further, at block 1730, for the two or more zones, a plurality of reconstruction parities is computed using the plurality of sub-fragments. At block 1740, a plurality of cross-zone parities is computed, based on an exclusive-or, using the plurality of sub-fragments and the plurality of reconstruction parities in the two or more zones. The plurality of sub-fragments and the plurality of reconstruction parities correspond across the two or more zones. At block 1750, the plurality of cross-zone parities are assigned to a parity zone. The plurality of cross zone parities provide at least cross-zone reconstruction of a portion the data.

Figure 18:
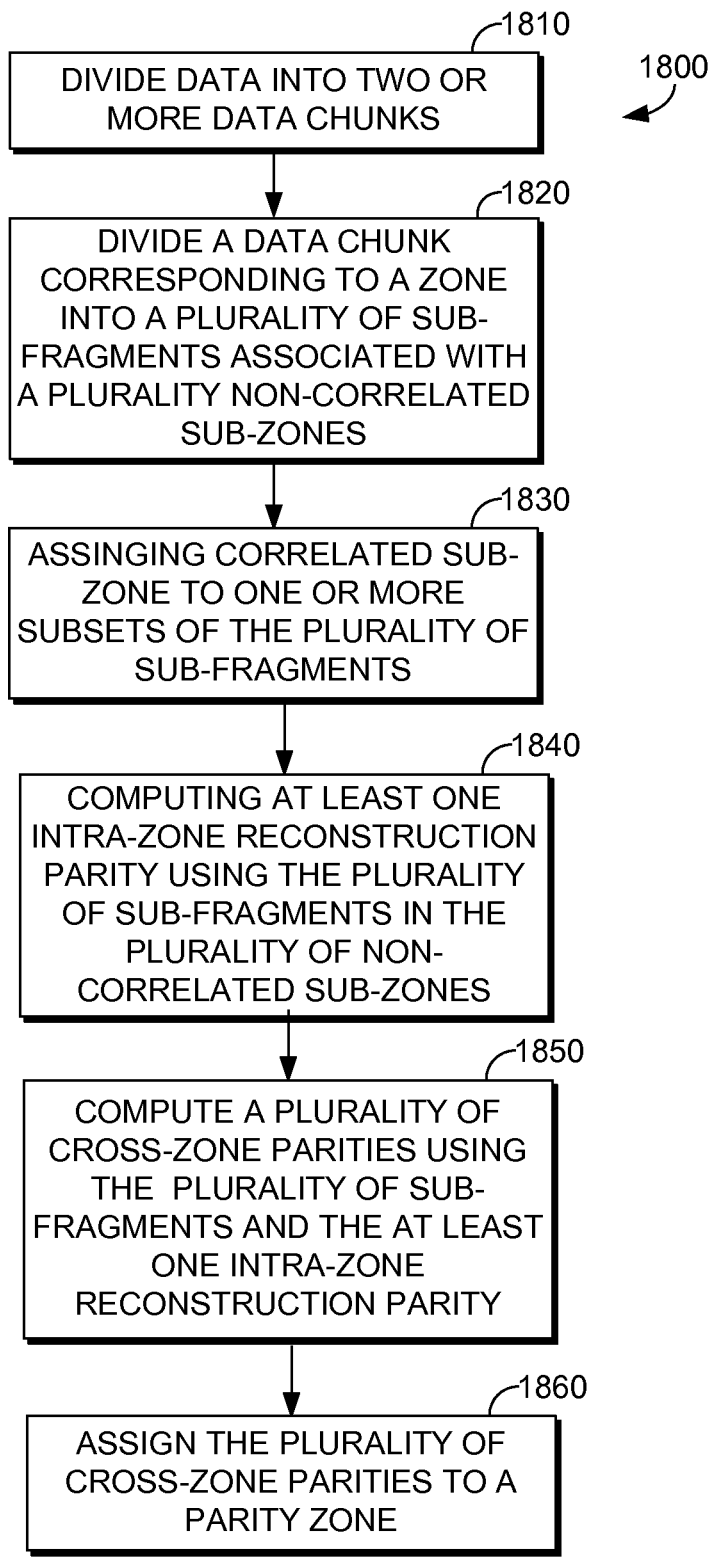
FIG. 18 is a flow diagram showing a method for erasure coding data across multiple zones, in accordance with embodiments of the present invention.

Turning now to FIG. 18, a flow diagram is provided that illustrates a method 1800 for erasure encoding data across multiple storage zones. At block 1810, data is divided into two or more data chunks. The two or more data chunks correspond to two or more zones. At block 1820, for the two or more zones, the data chunk corresponding to the zone is divided into a plurality of sub-fragments. Each of the plurality of sub-fragments is associated with one of a plurality non-correlated sub-zones. At block 1830, one or more subsets of the plurality of sub-fragments are assigned correlated sub-zones. Further, at block 1840, for the two or more zones, at least one intra-zone reconstruction parity is computed using the plurality of sub-fragments in the plurality of non-correlated sub-zones. At block 1850, a plurality of cross-zone parities are computed using the plurality of sub-fragments and the at least one intra-zone reconstruction parity two or more zones. The plurality of sub-fragments and the at least one intra-zone reconstruction parity correspond across the two or more zones. At block 1860, the plurality of cross-zone parities are assigned to a parity zone. The plurality of cross zone parities provide at least one cross-zone reconstruction of a portion the data.

Figure 19:
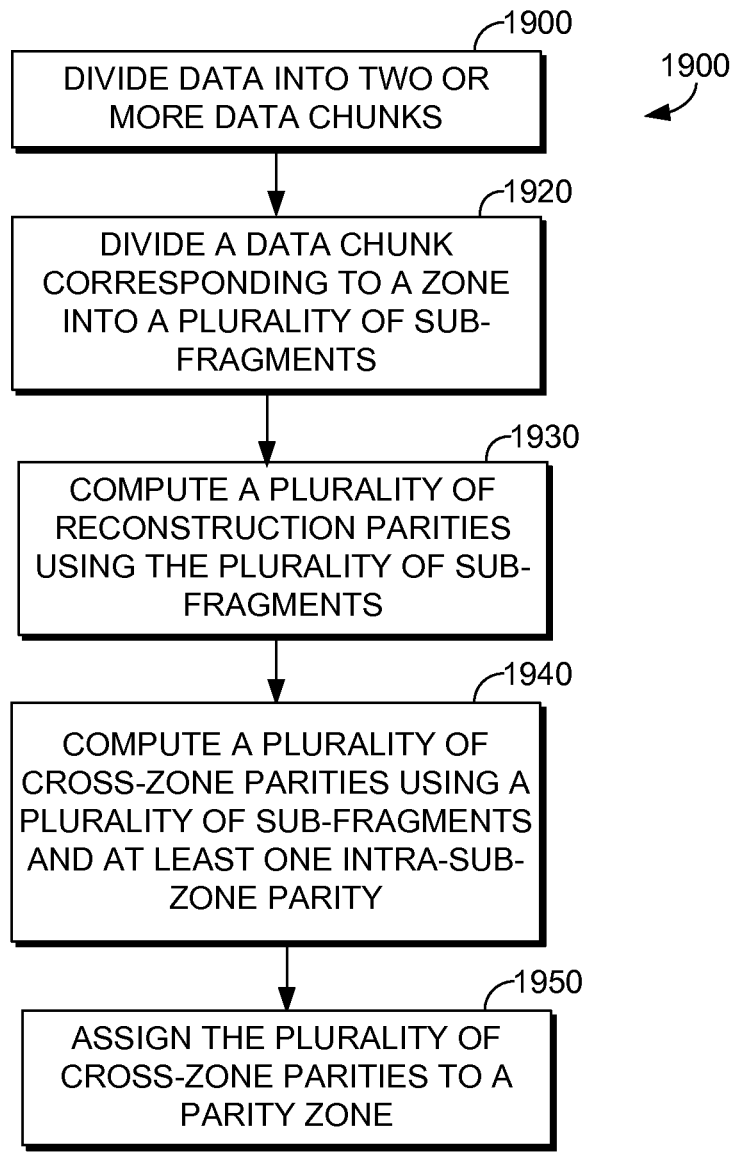
FIG. 19 is a flow diagram showing a method for erasure coding data across multiple zones, in accordance with embodiments of the present invention.

Turning now to FIG. 19, a flow diagram is provided that illustrates a method 1900 for erasure encoding data across multiple storage zones. At block 1910, data is divided into two or more data chunks. The two or more data chunks correspond to two or more zones. At block 1920, for the two or more zones, the data chunk corresponding to the zone is divided into a plurality of sub-fragments. Each of the plurality of sub-fragments is associated with one of a plurality sub-zones. Further, at block 1930, for the two or more zones, a plurality of reconstruction parities is computed using the plurality of sub-fragments. The plurality of reconstruction parities includes at least one intra-sub-zone reconstruction parity. At block 1940, a plurality of cross-zone parities are computed using the plurality of sub-fragments and the at least one intra-sub-zone parity in the two or more zones. The plurality of sub-fragments and the plurality of reconstruction parities may correspond across the two or more zones. At block 1950, the plurality of cross-zone parities are assigned to a parity zone. The plurality of cross-zone parities provides at least cross-zone reconstruction of a portion the data.

Embodiments of the present invention have been described in relation to particular embodiments which are intended in all respects to be illustrative rather than restrictive. Alternative embodiments will become apparent to those of ordinary skill in the art to which the present invention pertains without departing from its scope.

From the foregoing, it will be seen that this invention in one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

The invention claimed is:

1. A computer-implemented method suitable for use in a distributed computing environment utilizing a processor and a memory for implementing erasure encoding data across multiple storage zones, the method comprising:
   dividing data into two or more data chunks, the two or more data chunks corresponding to two or more zones;
   for each of the two or more zones:
   dividing a data chunk corresponding to a zone, into a plurality of sub-fragments, each of the plurality sub-fragments associated with one of a plurality sub-zones; and
   computing a plurality of reconstruction parities using the plurality of sub-fragments;
   computing a plurality of cross-zone parities based on an exclusive-or using the plurality of sub-fragments and the plurality of reconstruction parities in the two or more zones, wherein the plurality of sub-fragments and the plurality of reconstruction parities are correspond across the two or more zones; and
   assigning the plurality of cross-zone parities to a parity zone, wherein the plurality of cross-zone parities provide at least cross-zone reconstruction of a portion of the data.

2. The method of claim 1, wherein computing the at least one cross-zone parity is based on an exclusive-or in a horizontal direction.

3. The method of claim 1, wherein computing the plurality of reconstruction parities using the plurality of sub-fragments further comprises at least one local parity and at least one zone parity.

4. The method of claim 3, wherein computing the at least one local parity is based on an exclusive-or in a horizontal direction and computing the at least one zone parity is based on an exclusive-or in a vertical direction.

5. The method of claim 3, further comprising assigning the at least one local parity and the at least one zone parity to a parity sub-zone.

6. The method of claim 1, further comprising: for each of the two or more zones, replacing an allocation for at least one zone parity with a replacement sub-fragment.

7. The method of claim 6, further comprising:
computing a cross-zone parity based on an exclusive-or in a horizontal direction of each of the replacement sub-fragment in each of the two or more zones;
assigning the cross-zone parity to parity zone, wherein the cross-zone parity is located in a corresponding location in the parity zone.

8. A computer-implemented method suitable for use in a distributed computing environment utilizing a processor and a memory for implementing erasure encoding data across multiple storage zones, the method comprising:
dividing data into two or more data chunks, the two or more data chunks corresponding to two or more zones;
for each of the two or more zones:
dividing a data chunk corresponding to a zone, into a plurality of sub-fragments, each of the plurality sub-fragments associated with one of a plurality non-correlated sub-zones;
assigning correlated sub-zones to one or more subsets of the plurality of sub-fragments; and
computing at least one intra-zone reconstruction parity using the plurality of sub-fragments in the plurality of non-correlated sub-zones;
computing a plurality of cross-zone parities using the plurality of sub-fragments and the at least one intra-zone reconstruction parity in the two or more zones, wherein the plurality of sub-fragments and the at least one intra-zone reconstruction parity correspond across the two or more zones; and
assigning the plurality of cross-zone parities to a parity zone, wherein the plurality of cross-zone parities provide at least cross-zone reconstruction of a portion of the data.

9. The method of claim 8, wherein computing the at least one intra-zone reconstruction parity is based on an exclusive-or in a horizontal direction.

10. The method of claim 8, wherein each of the plurality of the correlated sub-zones is assigned to at least one sub-fragment in each zone.

11. The method of claim 8, wherein each of the plurality of the correlated sub-zones is assigned to the plurality of sub-fragments located in a different position each zone.

12. The method of claim 8, wherein computing the plurality of cross-zone parties is based on an exclusive-or in a vertical direction.

13. The method of claim 8, further comprising: for each of the two or more zones, replacing an allocation for at least one sub-fragment with a replacement reconstruction parity.

14. The method of claim 13, further comprising:
computing a cross-zone parity based on an exclusive-or in a horizontal direction of the replacement reconstruction parity;
assigning the cross-zone parity to parity zone, wherein the cross-zone parity is located in a corresponding location in the parity zone.

15. A computer-implemented method suitable for use in a distributed computing environment utilizing a processor and a memory for implementing erasure encoding data across multiple storage zones, the method comprising:
dividing data into two or more data chunks, the two or more data chunks corresponding to two or more zones;
for each of the two or more zones:
dividing a data chunk corresponding to a zone, into a plurality of sub-fragments, each of the plurality sub-fragments associated with one of a plurality sub-zones; and
computing a plurality of reconstruction parities using the plurality of sub-fragments, wherein the plurality of reconstruction parities include at least one intra-sub-zone reconstruction parity;
computing a plurality of cross-zone parities using the plurality of sub-fragments and the at least one intra-sub-zone reconstruction parity in the two or more zones; and
assigning the plurality of cross-zone parities to a parity zone, wherein the plurality of cross-zone parities provide at least cross-zone reconstruction of a portion of the data.

16. The method of claim 15, wherein computing the at least one intra-sub-zone reconstruction parity is based on an exclusive-or in a horizontal direction within a selected sub-zone.

17. The method of claim 15, wherein the plurality of reconstruction parities includes a plurality of global parities.

18. The method of claim 15, wherein the plurality of cross-zone parities comprises inter-zone parities computed based on an exclusive-or in a vertical direction.

19. The method of claim 15, further comprising: for each of the two or more zones, replacing computing the plurality of reconstruction parities using balanced local reconstruction code with frugal reconstruction code.

20. The method of claim 15, further comprising:
computing a plurality of global parities using all sub-fragments from the one or more zones.

* * * * *